(12) United States Patent
Thiers et al.

(10) Patent No.: US 12,354,688 B2
(45) Date of Patent: Jul. 8, 2025

(54) METHOD AND SYSTEM FOR READ REFERENCE VOLTAGE CALIBRATION FOR NON-VOLATILE MEMORIES

(71) Applicant: HYPERSTONE GMBH, Constance (DE)

(72) Inventors: Johann-Philipp Thiers, Constance (DE); Daniel Nicolas Bailon, Constance (DE); Juergen Freudenberger, Constance (DE); Jianjie Lu, Constance (DE)

(73) Assignee: HYPERSTONE GMBH (DE)

(*) Notice: Subject to any disclaimer, the term of this patent is extended or adjusted under 35 U.S.C. 154(b) by 339 days.

(21) Appl. No.: 17/939,718

(22) Filed: Sep. 7, 2022

(65) Prior Publication Data
US 2023/0072467 A1     Mar. 9, 2023

(30) Foreign Application Priority Data

Sep. 7, 2021   (DE) .......................... 102021123139.6
Sep. 9, 2021   (DE) .......................... 102021123401.8

(51) Int. Cl.
*G11C 29/42*     (2006.01)
*G11C 29/12*     (2006.01)

(52) U.S. Cl.
CPC ........ *G11C 29/42* (2013.01); *G11C 29/12005* (2013.01); *G11C 29/1201* (2013.01)

(58) Field of Classification Search
CPC ....................................................... G11C 29/42
USPC ....................................................... 365/185.09
See application file for complete search history.

(56) References Cited

U.S. PATENT DOCUMENTS

| | | | |
|---|---|---|---|
| 2019/0348133 A1* | 11/2019 | Chen .................... | G11C 11/5642 |
| 2021/0065807 A1* | 3/2021  | Tang ................... | H03K 19/0005 |
| 2022/0299378 A1* | 9/2022  | Yang .................... | G11C 29/021 |
| 2022/0300186 A1* | 9/2022  | Muchherla ............ | G06F 3/0653 |
| 2024/0265959 A1* | 8/2024  | Sivero ................. | G11C 11/2273 |

OTHER PUBLICATIONS

Zhang, X.; Parhi, K.K. High-speed architectures for parallel long BCH encoders. IEEE Transactions on Very Large Scale Integration (VLSI) Systems 2005.*

(Continued)

*Primary Examiner* — Muna A Techane
(74) *Attorney, Agent, or Firm* — Jaffery Watson Hamilton & DeSanctis LLP

(57) ABSTRACT

A method for read reference voltage calibration of a non-volatile memory, NVM, such as flash memory, particularly of the NAND type, comprises: Reading from the NVM predetermined reference data stored therein and being encoded with an error correction code, ECC, wherein the reading is performed when a read reference voltage of the NVM, which is used as a reference voltage, such as a threshold voltage, for the reading, is set at a defined voltage level; decoding the read data and observing a number of bit errors, e.g., in a codeword, of the read data in relation to the reference data; and defining a new voltage level of the read reference voltage for a subsequent reading of data from the NVM based on the observed number of bit errors and setting the read reference voltage to the defined new voltage level.

20 Claims, 9 Drawing Sheets

(56) References Cited

OTHER PUBLICATIONS

Cho, S.; Kim, D.; Choi, J.; Ha, J. Block-Wise Concatenated BCH Codes for NAND Flash Memories. IEEE Transactions on Communications 2014.*

Dong, G.; Xie, N.; Zhang, T. On the Use of Soft-Decision Error-Correction Codes in NAND Flash Memory. IEEE Transactions on Circuits and Systems I: Regular Papers 2011.*

MacKay, D.Information Theory, Inference, and Learning Algorithms; Cambridge UniversityPress, 2003.*

Micheloni, R.; Marelli, A.; Ravasio, R. Error Correction Codes for Non-Volatile Memories; Springer, 2008.

Spinelli, A.S.; Compagnoni, C.M.; Lacaita, A.L. Reliabilityof NAND Flash Memories: Planar Cells and Emerging Issues in 3D Devices. Computers 2017.

Dolecek, L.; Cassuto, Y. Channel Coding for Nonvolatile Memory Technologies: Theoretical Advances and Practical Considerations. Proceedings of the IEEE 2017.

Freudenberger, J, A configurable Bose-Chaudhuri-Hocquenghem codec architecture for flash controller applications. Journal of Circuits, Systems, and Computers2014.

Spinner, J.; Freudenberger, J.; Shavgulidze, S. A Soft Input Decoding Algorithm for Generalized Concatenated Codes. IEEE Transactions on Communications2016.

Spinner, J.; Rohweder, D.; Freudenberger, J. Soft input decoder for high-rate generalised concatenated codes. IET Circuits, Devices Systems 2018.

Rajab, M.; Soft-input Bit-flipping Decoding of Generalized Concatenated Codes for Application in Non-volatile Flash Memories. IET Communication, IET Communications 2018.

Zhao K., LDPC-in-SSD: Making Advanced Error Correction Codes Work Effectively in Solid State Drives. Presented as part of the 11th USENIX Conference on FAST 13, 2013.

Wang, J., Enhanced Precision Through Multiple Reads for LDPC Decoding in Flash Memories. IEEE Journal on Selected Areas in Communications 2014.

Lin, W., A low power and ultra-high reliability LDPC error correction engine with Digital Signal Processing for embedded NAND Flash Controller in 40nm CMOS. Symp. on VLSI 2014.

Haymaker, K.; Kelley, C.A. Structured Bit-Interleaved LDPC Codes for MLC Flash Memory. IEEE Journal on Selected Areas in Communications 2014.

Sandell, M.; Ismail, A. Machine Learning for LLR Estimation in Flash Memory With LDPC Codes. IEEE Transactions on Circuits and Systems II: Express Briefs 2021.

Bian, J.; Zhao, S.; Kong, L. Rate-adaptive Polar Codes Design for MLC NAND Flash Memory. IEEE 4th International Conference on Computer and Communications (ICCC), 2018.

Kong, L.; Liu, Y.; Liu, H.; Zhao, S. Protograph QC-LDPC and Rate-Adaptive Polar Codes Design for MLC NAND Flash Memories. IEEE Access 2019.

Taranalli, V.; Uchikawa, H.; Siegel, P.H. Channel Models for Multi-Level Cell Flash Memories Based on Empirical Error Analysis. IEEE Transactions on Communications 2016.

Freudenberger, J, Estimation of channel state information for non-volatile flash memories. IEEE 7th International Conference on Consumer Electronics 2017.

Freudenberger, J.; A Source and Channel Coding Approach for Improving Flash Memory Endurance. IEEE Transactions on Very Large Scale Integration (VLSI) Systems 2018.

Sala, F.; Gabrys, R.; Dolecek, L. Dynamic Threshold Schemes for Multi-Level Non-Volatile Memories. IEEE Transactions on Communications 2013.

Cao, C.; Mitigation of Inter-Cell Interference in Flash Memory With Capacity-Approaching Variable-Length Constrained Sequence Codes. IEEE Jrnl on Selected Areas in Comm. 2016.

Yassine, H., Index Programming for Flash Memory. IEEE Transactions on Communications 2017.

Park, S.K.; Moon, J. Characterization of Inter-Cell Interference in 3D NAND Flash Memory. IEEE Transactions on Circuits and Systems I: Regular Papers2021.

Cai, Y., Data retention in MLC NAND flash memory: Characterization, optimization, and recovery. IEEE 21st International Symposium on HPCA 2015.

Qi, S.; Feng, D.; Liu, J. Optimal voltage signal sensing of NAND flash memory for LDPC code. Signal Processing Systems (SiPS), 2014.

Zhou, H., Error-correcting schemes with dynamic thresholds in nonvolatile memories. Information Theory Proceedings (ISIT), 2011 IEEE International Symp. 2011.

Lee, D.; Sung, W. Estimation of NAND Flash Memory Threshold Voltage Distribution for Optimum Soft-Decision Error Correction. IEEE Transactions on Signal Processing2013.

Lee, D.h.; Sung, W. Decision Directed Estimation of Threshold Voltage Distribution in NAND Flash Memory. IEEE Transactions on Signal Processing2014.

Peleato, B.; Agarwal, R.; Cioffi, J.M.; Qin, M.; Siegel, P.H. Adaptive read thresholds for NAND flash. IEEE Transactions on Communications 2015.

Rajab, M.; Read Threshold Calibration for Non-Volatile Flash Memories. IEEE 9th International Conference on Consumer Electronics (ICCE-Berlin), 2019.

Yang, L.; Wang, Q.; Li, Q.; Yu, X.; He, J.; Huo, Z. Gradual Channel Estimation Method for TLC NAND Flash Memory. IEEE Embedded Systems Letters2021.

Cai, Y.; Threshold voltage distribution in MLC NAND flash memory: Characterization, analysis, and modeling. 2013 Design, Auto. Test in Europe Conference Exhibition (Date), 2013.

Thiers, J.P.; Bit-Labeling and Page Capacities of TLC Non-Volatile Flash Memories. IEEE 10th International Conference on Consumer Electronics (ICCE-Berlin), 2020.

Miccoli, C.; A. Cycling pattern and read/bake conditions dependence of random telegraph noise in decananometer NAND flash arrays. IEEE Intntl Reliability Physics Symp. 2015.

Samadder, T.; A Theoretical Framework for Trap Generation and Passivation in NAND Flash Tunnel Oxide During Distributed Cycling and Retention Bake. (IRPS), 2021.

Yaakobi, E.; Ma, J.; Grupp, L.; Siegel, P.; Swanson, S.; Wolf, J.Error characterization and coding schemes for flash memories. IEEE Globecom Workshops, 2010.

Cover, T.M.; Thomas, J.A.Elements of Information Theory; John Wiley & Sons, 1991.

* cited by examiner

METHOD AND SYSTEM FOR READ REFERENCE VOLTAGE CALIBRATION FOR NON-VOLATILE MEMORIES

FIELD OF THE INVENTION

The present invention relates to the field of non-volatile memory technology, such as flash memories. Specifically, the invention is directed to a method (calibration method) and a memory controller for read reference calibration of non-volatile memories, a memory system comprising an NVM and the memory controller, and a computer program configured to perform the method. In addition, the invention relates to a look-up-table-generation method for determining a look-up table, LUT, for use in the calibration method.

In the following, numbers in brackets (such as [3] or [4,5] etc.) refer to certain documents of the prior art, as identified in the list of references provided at the end of the description.

BACKGROUND

Non-volatile flash memories (NVM) are often applied for storage systems that require high data reliability, e.g., in industrial robots, scientific and medical instruments. A very common type of NVM are so-called flash memories. They are resistant to mechanical shock and provide fast read access times. The information is stored in floating gate transistors that hold the charge in the absence of power. The cells can be programmed and erased. To distinguish the charge levels and read the stored information, several reference voltages are applied to the control gate. However, this reading operation can cause errors due to the physical characteristics of the flash memory cell.

Error correction coding (ECC) is required to ensure reliability and data integrity [1-3]. Traditionally, Bose-Chaudhuri-Hocquenghem (BCH) codes with so-called hard-input decoding were used for error correction [4,5]. The term "hard-input" refers to a reading procedure where only a single bit of information is read from each cell. However, the performance of error correction can be improved with soft-input decoding, where the channel output is quantized using a small number of bits to obtain reliability information about the state of the cells [6,7]. Soft-input decoding algorithms exploit this reliability information, e.g., generalized concatenated codes (GCC) [8-10], low-density parity-check (LDPC) codes [11-15], and polar codes [16,17] were proposed for flash memories with soft-input decoding.

The error probability of the flash cells depends on the flash memory technology (such as single-level cell (SLC), multi-level cell (MLC), triple-level cell (TLC), or quad-level cell (QLC)), the storage density, and the number of programming and erasing cycles. A lot of research on the error characteristics of flash memory considers the flash memory endurance [2,18-20], i.e., on the error characteristics under program/erase (P/E) cycling stress. Additionally, the storage reliability may suffer from temperature-related charge loss, read disturb, and inter-cell interference [21-24]. Charge losses occur over time, which cause a change of the threshold voltage distribution. Data retention is a parameter that specifies the time since the cells were programmed [25]. In many applications, data retention is more important than flash endurance. Likewise, charge losses related to read disturb, inter-cell interference, and/or temperature occur. Such a charge loss typically results in a shift of the threshold voltage. These voltage shifts increase the error probability if the reference voltages are not adapted to the actual life-cycle conditions.

Compared with hard-input read operation, the threshold voltage sensing operation to obtain the soft information causes a larger latency and a higher energy consumption [26]. Hence, the soft-input decoding should only be used for blocks where the hard-input decoding fails. Algorithms that adapt the read references can reduce the latency and energy consumption by avoiding soft-reads. Moreover, many soft-input decoding approaches assume reading procedures that maximize the mutual information between the input and output of flash memory. This requires an accurate adaptation of the read voltages and additional estimation of log-likelihood ratios (LLR) for the quantization intervals [15,19].

Several publications have proposed dynamic threshold adaptation concepts [27-33], which adjust the read references in order to minimize bit error rates. These reference adaptation schemes can significantly reduce the error probabilities. For instance, the flash controller may apply a read-retry mechanism to dynamically adjust the reference voltages. First, the controller reads the data with the default read reference. If the ECC decoder corrects the errors, there is no need to adapt the default value. In the case of decoding failures, the flash controller may read several times using a certain set of read threshold voltages until the decoder can correct the errors. However, such read-retry mechanisms can be very time-consuming.

In order to obtain statistical information about the cell state, a sensing directed estimation method was proposed in [28]. This method approximates the threshold voltage distribution as a Gaussian mixture. It estimates the mean and standard deviation values based on measured distributions. This scheme does not utilize any known pilot bits but employs extra memory sensing operations similar to the read-retry mechanisms. Such voltage sensing operations incur a larger energy consumption and a latency penalty. Similarly, a parameter estimation approach and an optimal threshold adaptation policy is derived in [31]. This adaptation method is also based on the assumption of Gaussian voltage distributions. However, the cell threshold voltage distributions of MLC and TLC are actually highly asymmetric with exponential tails [20,34,35]. In [27,29], coding schemes are proposed that exploit the asymmetric error probabilities of the channel, e.g., based on Berger codes. Berger codes cannot correct any errors but are used for error detection. They can detect any number of one-to-zero errors, as long as no zero-to-one errors occurred in the same codeword. Likewise, Berger codes can detect any number of zero-to-one errors, as long as no one-to-zero bit-flip errors occur in the same code word.

SUMMARY OF THE INVENTION

It is an object of the present invention to provide an improved approach for minimizing the bit error rate (BER) for readouts from NVM, such as flash memory, particularly of the NAND type.

A solution to this problem is provided by the teaching of the independent claims. Various preferred embodiments of the present invention are provided by the teachings of the dependent claims.

A first aspect of the present solution is directed to a method for read reference voltage calibration of a non-volatile memory, NVM, such as flash memory, particularly of the NAND type. The method comprises:

(i) Reading from the NVM predetermined reference data stored therein and being encoded with an error correction code, ECC, wherein the reading is performed when a read reference voltage of the NVM, which is used as a reference voltage, such as a threshold voltage, for the reading, is set at a defined voltage level;

(ii) decoding the read data and observing a number of bit errors. e.g., in a codeword, of the read data in relation to the reference data; and (iii) defining a new voltage level of the read reference voltage for a subsequent reading of data from the NVM based on the observed number of bit errors and setting the read reference voltage to the defined new voltage level.

The new voltage level will generally be different than the previous voltage level, although in some instances, particularly when no or very few bit errors have been observed, it might be the same.

The method may particularly be performed by a NVM controller, such as a NVM controller chip or an NVM-controller section of a higher integrated chip, such as an integrated circuit comprising an embedded NVM and further functionality, e.g., one or more logic circuits, e.g., processors beyond its NVM functionality.

Unless otherwise specified in detail, the term "error" or "errors", as used herein, refers to a bit error, and the term "BER" refers to a corresponding rate of occurring errors, i.e., a bit error rate. Accordingly, the terms "error" and "bit error" are used herein as equivalents.

The term "NVM", as used herein, refers to any type of non-volatile memory, where reading from the memory data stored therein involves an application of one or more reference voltages for determining a content of the data, particularly the respective value of one or more bits of the read-out data. In particular, an NVM may be a flash memory, particularly of the NAND type, a ferroelectric random-access memory (FRAM or FeRAM) or a magnetoresistive random-access memory (MRAM)

The term "reference data", as used herein, refers particularly to specific data stored in the NVM, where the content of this data is pre-determined and thus known upfront before execution of the methos and is thus available as a reference for a comparison with other (unknown) data, such as potentially error-hearing data read out from the NVM in the course of the method of the first aspect. Specifically, reference data may comprise data other than payload data (e.g., user data). Particularly, reference data may comprise non-payload data that is used or even needed for the operation of the NVM or its NVM controller itself or which represents a current state or condition of the NVM or its NVM controller.

The term "error correction code (or coding)" and its common abbreviation "ECC", as used herein, each refer particularly to a code or coding (encoding/decoding) process that is used for controlling errors in data over unreliable or noisy communication channels, such as a communication link or a data memory. The central idea is that the sender or other data source encodes the data with redundant information in the form of an ECC. The redundancy allows the receiver of the data to detect a limited number of errors that may occur anywhere in the data, and often to correct these errors without retransmission. Specifically in the case of the channel being a memory, the data is ECC-encoded before or upon storing it into the memory, an ECC-decoded when or after reading the stored data from the memory. If somewhere in the process of storing the data, maintaining it in the memory, or retrieving it from the memory, one or more errors in the data have occurred, these errors can be detected and corrected within the respective capabilities of the ECC being used. Particularly, each of the specific error correction coding types mentioned in the background part above, such as BCH codes or GCC codes, may be used as an ECC, as defined herein.

Unless specified otherwise in detail, the terms "encoding" and "decoding", and variations thereof, as used herein, relate to ECC-encoding and decoding, respectively.

The terms "first", "second", "third" and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Unless the context requires otherwise, where the term "comprising" or "including" or a variation thereof, such as "comprises" or "comprise" or "include", is used in the present description and claims, it does not exclude other elements or steps and are to be construed in an open, inclusive sense, that is, as "including but not limited to".

Where an indefinite or definite article is used when referring to a singular noun e.g., "a" or "an", "the", this includes a plural of that noun unless something else is specifically stated.

Appearances of the phrases "in some embodiments", "in one embodiment" or "in an embodiment", if any, in the description are not necessarily all referring to the same embodiment. Furthermore, the particular features, structures, or characteristics may be combined in any suitable manner in one or more embodiments.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

The method of read reference voltage calibration of the first aspect aims particularly at minimizing the BER and exploits the error correction code to obtain information about the cell states of the involved NVM (cells). Based on the number of observed errors, i.e., bit errors, in the read codeword, a shift of the read reference voltage(s) is predicted and utilized for an (at least) initial calibration of the read reference voltage(s), e.g., threshold voltages of the NVM cells. It was found and demonstrated that the observed number of errors is a good measure for the voltage shifts and is therefore utilized for the (initial) calibration of one or more, preferably all, the read reference voltage(s).

While the calibration might not always, and typically does not, result in the (absolutely) optimal threshold voltage for each page of the NVM, the achieved BER is very close to the minimum possible error rate. Hence, this method can provide a sufficiently precise calibration.

A further advantage, which can be achieved with the method, is that it may be very efficient during operation, because a data basis for determining the voltage shifts may already be defined before and independently from performing the method, e.g., in the course of post-production testing of the NVM before its delivery and use in the field.

In the following, preferred embodiments of the method are described, which can be arbitrarily combined with each other or with other aspects of the present invention, unless such combination is explicitly excluded or technically impossible.

In some embodiments, the method comprises:

a) setting the read reference voltage to a predefined initial voltage level;

b) performing at least one iteration run of an iterative decoding process until an exit criterion for a successful decoding is met, the decoding process comprising:

(b1) reading the reference data from the NVM using the read reference voltage at the currently-set voltage level as a reference for the reading;

(b2) determining, whether the currently read reference data is decodable;

(b3) if the currently read reference data is found to be not decodable, such as when a decoding failure occurs, setting the read reference voltage to an adapted voltage level being different from each of the initial voltage level and the voltage level the preceding run, preferably each preceding run, of the decoding process, if any;

(b4) else, decoding the currently read reference data;

observing a number of bit errors in the current read reference data, e.g., in a codeword thereof, in relation to the reference data;

defining the new voltage level of the read reference voltage for a subsequent reading of data from the NVM based on the observed number of bit errors and setting the read reference voltage to the defined new voltage level.

This iterative process has the benefit, that even if the initial voltage level is too far off an optimal voltage level, such that a successful decoding is not possible, the process is capable of adapting in one or more steps (iterations) so as to reach a situation, where a successful decoding and hence a successful determination of the number of errors in the read data and as a consequence a successful calibration become possible.

In some embodiments, the method further comprises an initialization process for determining the predefined initial voltage level. The initialization process comprises determining the initial voltage level based on a voltage level of the read reference voltage used for reading at which a maximum of the mutual information $I(E, V_p)$ between the optimal voltage level $V_{opt}$ of the reference voltage and an observed number E of bit errors in reference data occurs, wherein the mutual information $I(E, V_{opt})$ is determined over a set of measurements of E and $V_{opt}$ at different life-cycle states of the NVM. As will be discussed in more detail below in connection with the figures, it has been found that the maximum of the mutual information $I(E, V_{opt})$ provides a good estimation of a (near-)optimal read reference voltage and can thus be used for determining same. This applies particularly to the initial voltage level to be determined by the initialization process.

The term "mutual information", as used herein, refers to a well-known concept in probability theory and information theory, where the mutual information of two random variables is a measure of the mutual dependence between the two variables. More specifically, it quantifies the "amount of information" (e.g., in units such as shannons (bits), nats or hartleys) obtained about one random variable by observing the other random variable. The concept of mutual information is intimately linked to that of entropy of a random variable, a fundamental notion in information theory that quantifies the expected "amount of information" held in a random variable. A mathematical formula for calculating the mutual information of two random variables X and Y in the case of discrete distributions is provided further below.

In some embodiments, the predetermined reference data comprises meta-data stored in the NVM, the meta-data representing one or more properties or states of the NVM and being encoded with a first ECC allowing for correcting a higher number of bit errors per codeword than a second ECC used for encoding payload data to be stored in the NVM. Hence, it is possible to correct the errors in the codeword of the first ECC (meta data ECC) even at a relatively large offset in the read reference voltage. This allows for a more robust process, particularly for a process that is less depending on how well the voltage levels, including particularly the initial voltage level, approximate the optimal read reference voltage level.

In some embodiments, defining the new voltage level of the read reference voltage based on the observed number of bit errors comprises looking up the new voltage level in a look-up table, LUT, that defines a target voltage level of the read reference voltage as a function of an information representing a number of observed bit errors in decoded reference data. This approach enables a separation of (i) the method for calibrating the read reference voltage(s), such as during operation of a memory controller of an NVM that implements the method, and (ii) a process for defining the LUT. Accordingly, the calibration method is not burdened with calculating the information that is available in the LUT and is thus discharged accordingly. The process for defining the LUT may particularly be performed as part of a manufacturing or pre-delivery testing process of a device, such as a NVM controller, and may be performed outside such a device, particularly on powerful test or computing equipment.

The total number of errors is a good measure to serve as a basis for read reference voltage calibration, as defined above, if there is a relatively large difference between the threshold for a first readout of the reference data and the optimal read threshold. However, the total number of errors is generally less suitable to estimate small changes of the read reference voltages which occur for different pages from the same block.

Therefore, in some embodiments, the method further comprises a tracking process which comprises further optimizing the determined new voltage level of the read reference voltage based on an observed symmetry or asymmetry, such as an equal probability for normal references with symmetric voltage distributions, and a probability offset for special references with asymmetric voltage distributions, of the number of 1-to-0 and 0-to-1 bit errors in payload data being read from the NVM.

The tracking process may be considered a gradual channel estimation method. Like the approach based on Berger codes (as discussed in the introduction above), and as will be discussed in more detail below with reference to the figures, such a tracking process exploits the asymmetric error probabilities by counting the one-to-zero (1-to-0) and the zero-to-one (0-1-to-1) errors independently. Based on the asymmetry, the tracking method can be used to (further) adjust the read reference voltages from page to page. Numerical results based on flash measurements demonstrate that the method (particularly when is includes the tracking process) can significantly reduce the BER of NAND flash memories and achieve nearly optimal performance.

In some embodiments involving the tracking process, optimizing the determined new voltage level of the read reference voltage comprises: (i) Setting for the read reference voltage an associated target probability, e.g., a target probability ratio, for the asymmetry or symmetry, respectively, of 1-to-0 and 0-to-1 bit errors; (ii) Reading payload data from the NVM, decoding it, and determining a number of 1-to-0 bit errors and a number of 0-to-1 bit errors in the read payload data; and (iii) Modifying the new voltage level based on the determined numbers of 1-to-0 bit errors and 0-to-1 bit errors such as to cause the ratio of these numbers to approach the target probability.

Specifically, in some of these embodiments modifying the new voltage level based on the determined numbers of 1-to-0 bit errors and 0-to-1 bit errors in the read payload data such as to cause the ratio of these numbers to approach the target probability comprises: (i) Defining a voltage step $\Delta V$; (ii) Performing at least one iteration run of the following iterative voltage level modification process, until the target probability for the asymmetry or symmetry, respectively, of 1-to-0 and 0-to-1 bit errors is met, at least within a defined error margin: (ii-1) reading payload data; (ii-2) if the determined number of 0-to-1 bit errors is larger than indicated by the target probability, decrease the new voltage level by $|\Delta V|$ for the next read operation for reading payload data: (ii-3) else, increase the new voltage level by $|\Delta V|$ for the next read operation for reading payload data. Accordingly, this process modifies the new voltage level using a stepwise tracking principle based on the determined numbers of 1-to-0 bit errors and 0-to-1 bit errors of read payload data in each step. This enables a highly accurate prediction of an optimal read reference voltage, which works well even when the initial reference voltage level is far away from the optimal read reference voltage (as long as a decoding and counting of errors remains possible).

In some embodiments, the target probability, e.g., target probability ratio, is set so as to define an equilibrium of 1-to-0 bit errors and 0-to-1 bit errors. This setting is particularly suitable in situations, particularly for specific read reference voltages, where a symmetrical of near-symmetrical error count for both types of bit errors may be expected. This may particularly be the case, where the NVM is already known to show for a considered read reference voltage symmetric or near-symmetric error probabilities such that the probabilities of 1-to-0 errors and 0-to-1 errors are substantially equal.

On the other hand, in some embodiments the target probability, e.g., target probability ratio, is set so as to define a particular ratio $R \neq 1$ of 1-to-0 errors and 0-to-1 bit errors. This setting is particularly suitable in situations, particularly for specific read reference voltages, where an asymmetrical error count for both types of bit errors may be expected. This may particularly be the case, where the NVM is already known to show for a considered read reference voltage asymmetric error probabilities such that the probabilities of 1-to-0 errors and 0-to-1 errors are different.

Also combinations are possible, such that for a first one of the read reference voltages of the NVM the target probability ratio is set so as to define an equilibrium of 1-to-0 bit errors and 0-to-1 bit errors, while for another one of the read reference voltages of the NVM the target probability ratio is set so as to define a particular ratio $R \neq 1$ of 1-to-0 errors and 0-to-1 bit errors.

In some embodiments, consecutive read operations for reading payload data during the tracking process are performed in relation to consecutive pages of a memory block of the NVM. Particularly, the tracking process may be performed with a first page or a last page of a memory block of the NVM and progress from page to next page in a consecutive manner through the memory block. A near-optimal read reference voltage of the first page or the last page, respectively, is then determined using the calibration method of the first aspect (without tracking) which is based on a counting of bit errors.

In some embodiments, the NVM comprises memory cells being capable of storing two or more bits each, such as MLC, TLC or QLC-cells, and the method of the first aspect, as described above, is performed in relation to multiple, preferably all, different read reference voltages of such memory cells of the NVM. For example, in the case of a TLC-Flash, a memory cell can store three bits, i.e., eight different states corresponding to eight different charge level ranges in the cell. Consequently, seven different read reference voltages are needed to distinguish these eight different states when reading out the cell or a word comprising the cell. Accordingly, these embodiments aim at minimizing the BER across multiple, particularly all bits of such memory cells of the NVM.

A second aspect of the present solution is directed to a memory controller being configured to perform the method of the first aspect to calibrate at least one read reference voltage of an NVM. Specifically, the memory controller may be a NVM controller chip or an NVM-controller section of a higher integrated chip, such as an integrated circuit comprising an embedded NVM and further functionality, e.g., one or more logic circuits, e.g., processors beyond its NVM functionality. The method of the first aspect may particularly be implemented as a computer program that is executable by the memory controller and which is stored in a memory which is accessible for the memory controller, e.g., as an internal memory of the memory controller, a separate external memory, or even the NVM to be controlled by the memory controller.

A third aspect of the present solution is directed to a memory system comprising an NVM and the memory controller of the second aspect for calibrating at least one read reference voltage of the NVM.

A fourth aspect of the present solution is directed to a computer program or non-transitory computer-readable storage medium comprising instructions which when executed on the memory controller of the second aspect cause the memory controller to perform the method of the first aspect.

The computer program (product) may in particular be implemented in the form of a data carrier on which one or more programs for performing the method are stored. Preferably, this is a data carrier, such as a CD, a DVD or a flash memory module. This may be advantageous, if the computer program product is meant to be traded as an individual product independent from the processor platform on which the one or more programs are to be executed. In another implementation, the computer program product is provided as a file on a data processing unit, in particular on a server, and can be downloaded via a data connection, e.g., the Internet or a dedicated data connection, such as a proprietary or local area network.

The memory controller of the second aspect or the system of the third aspect may accordingly have a program memory in which the computer program is stored. Alternatively, the memory controller or the system, respectively, may also be set up to access a computer program available externally, for example on one or more servers or other data processing units, via a communication link, in particular to exchange with it data used during the course of the execution of the computer program or representing outputs of the computer program.

A fifth aspect of the present solution is directed to a LUT-generation method for determining the look-up table, LUT, for use in embodiments of the method of the first aspect which make use of such a LUT. The LUT-determining method comprises:
(i) Generating or receiving measurement data representing for each measurement in a set of multiple measurements for each of one or more, preferably all pages of a given NVM an observed number of bit errors in reference data, e.g., meta-data, read from the page as a function of a respective varied test voltage level for each read reference voltage related to the page;
(ii) Determining for each of the pages and each read reference voltage related to the page an optimal voltage level of the read reference voltage such that it minimizes over all measurements in the set the bit error probability for bit decisions (preferably all bit decisions) being based on the read reference voltages related to the page;
(iii) Determining for each of the pages a respective voltage, $V_{max}$, that maximizes, over all measurements relating to that page in the set, the mutual information between the number of observed bit errors in the read reference data and a respective optimal voltage level of each read reference voltage related to that page;
(iv) for each of the pages, determine the number of bit errors in each page's reference data when reading at the page's $V_{max}$; and
(v) Determining data for the LUT, comprising:
Clustering the pages according to the number of bit errors in their respective reference data;
for each cluster, calculate a respective point, e.g., centroid of all optimal read reference voltage levels observed in the cluster, as a representative of the cluster and define a respective target voltage level of each reference voltage related to that page as a related coordinate of the point; and
for each cluster, fill one associated line (row or column) in the LUT with the one or more determined target voltage levels for that cluster.
The point representing the cluster may particularly be calculated as a centroid of the cluster which minimizes the average Euclidean distance between the centroid and the cluster points, or which minimizes a mean bit error rate (BER) within the cluster, respectively.
Optionally, determining data for the LUT may further comprise merging all clusters corresponding to at least $E_{max}$ bit errors, i.e., generating one additional cluster for all readings which were not decodable because their (usually not exactly know n) number of observed errors E exceeds the maximum number $E_{max}$ of errors the ECC can correct ($E>E_{max}$). This additional cluster may then be treated similarly as the other clusters for $E \le E_{max}$. This approach is particularly helpful in view of limiting the number of unsuccessful prior runs of the calibration procedure.
While the LUT-Generation process may be implemented such as to be performed by the memory controller itself, it may instead be performed by a different computing entity, e.g., in the course of development of the memory controller. In each case, the resulting LUT will then be made available to the memory controller, e.g., by storing it into a memory that is accessible by the memory controller, such as an internal memory of the memory controller itself.

BRIEF DESCRIPTION OF THE DRAWINGS

Further advantages, features and applications of the present invention are provided in the following detailed description and the appended figures, wherein.

DETAILED DESCRIPTION

The detailed description provided below is organized as follows. Section 1 comprises a review of some basic properties of flash memories, which are considered herein as a specific example of NVMs for which the present solution may be used and introduces a model for the threshold distributions. Section 2 presents measurement results that motivate the present solution and describe a principal approach on which it is based. Moreover, we the information-theoretical measures that are used to analyze and optimize the threshold calibration are introduce. A calibration method for determining the read reference voltages is detailed in Section 3 and an additional gradual estimation method (tracing process) in Section 4. Section 5 comprises exemplary embodiments of Section 6 comprises a conclusion.

1. Models for Voltage Distributions and Measurement Data

In this section, some basic properties of flash memories (as a prominent example of NVM) are discussed and a notation used herein is introduced. Furthermore, a model for estimating the threshold voltage distributions is considered. This curve fitting approach is used to determine the optimal read reference voltages.

Flash memory consists of transistors which have an insulated floating gate below a control gate. The information is stored as electric charges in the floating gate. The charge levels affect the threshold voltage of the transistor. The cell can be charged by applying a high program voltage to the control gate and erased by applying a high erase voltage to the substrate. The information can be read out by applying a reference threshold (reference voltage) to differentiate erased and charged cells. The cells are organized in arrays of blocks and pages, where the control gates of the cells inside a page are connected using the so-called word line. Multiple pages constitute a block by connecting the drain of one cell to the source of the next cell. These connections form the bit lines.

1.1 Threshold Voltage Distributions

NAND flash technologies are differentiated by the number of bits stored per cell. While SLC flash stores only one bit per cell, TLC flash stores three bits per cell. Hence, a TLC flash requires eight different charge levels ($L_0, \ldots, L_7$) and seven reference voltages ($r_1, \ldots, r_7$) to read all three bits. The three bits of each cell are typically mapped to three different pages called MSB-, CSB-, and LSB-page, where MSB, CSB, and LSB stand for most significant bit, center significant bit, and least significant bit, respectively.

Figure 1:
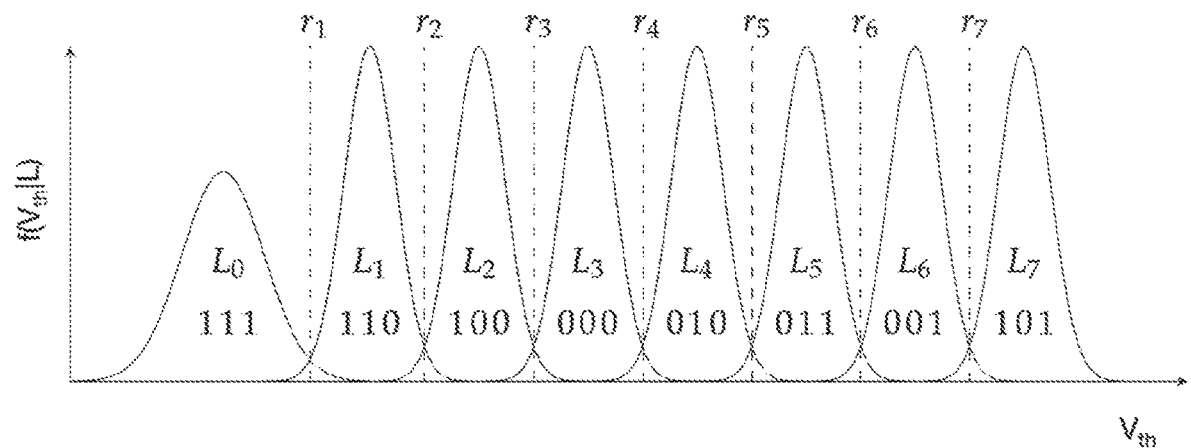
FIG. 1 illustrates an example for a voltage distribution of a TLC flash memory, read reference voltages (dashed lines), and bit-labeling.

FIG. 1 illustrates the conditional distributions $f(V_{th}|L)$ of the threshold voltages $V_{th}$ of the flash cells given the charge levels L. The figure also provides a possible bit-labeling for the charge levels, where each digit indicates the corresponding page, i.e., first bit: MSB, second bit: CSB in blue, and third bit: LSB. Most flash memories support page-wise read operations. For instance, to read the MSB-page with the bit-labeling in FIG. 1, we need to read at the reference voltages $r_3$ and $r_7$. Then, charge levels L3 to L6, where in each case MSB=0, can be distinguished form charge levels L0 to L2 and L7, where in each case MSB=1.

The distributions f(Vth|L) are not static but change over the lifetime of the flash. Two of the most important factors for these changes are the number of program/erase (P/E) cycles and the data retention time. The P/E cycles lead to a wear-out of the floating gate, while the data retention time leads to a charge loss. The distributions also depend on effects like the program and read temperature and the charges of adjacent cells. Moreover, they can vary over pages and blocks. The threshold distributions can be measured by successively applying all possible threshold voltages and counting the number of cells which are activated for the given voltage and charge level. For those measurements the data retention time is simulated by baking the chip for a specific time [36, 37].

Figure 2:
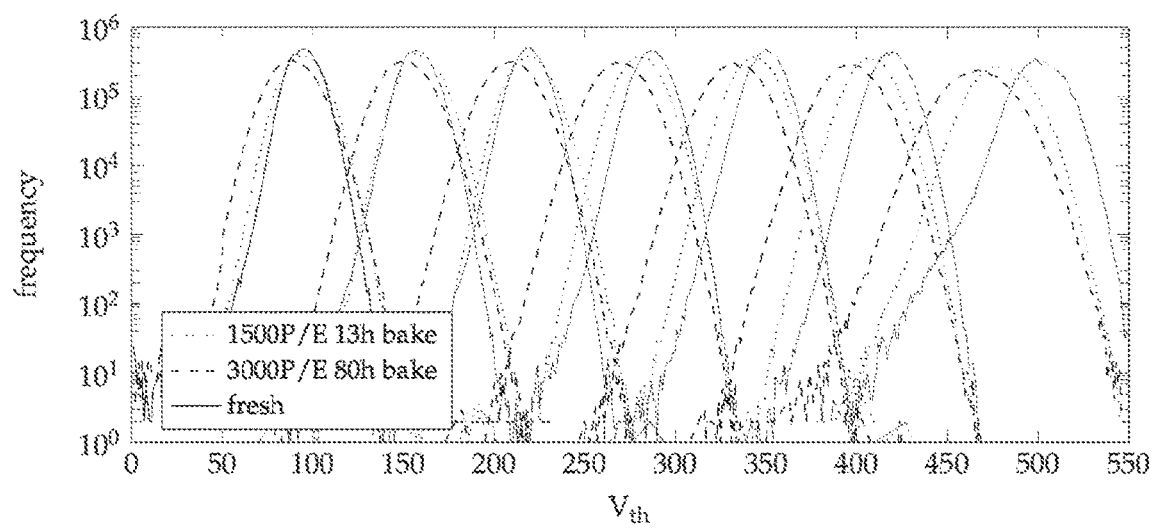
FIG. 2 illustrates exemplary measurements of TLC flash memory in different life-cycle states.

FIG. 2 shows measured histograms for three different life-cycle states. The measurements were performed using (i) fresh cells, (ii) cells with 1500 P/E-cycles and 13 hours of baking, which simulates about two months of data retention, and (iii) cells with 3000 P/E-cycles and 80 hours of baking, which corresponds to the end of life (EOL) defined by the manufacturer. Note that only the charged states $L_1$ to $L_7$ are shown. The voltages $V_{th}$ are represented by the index numbers of the possible voltage steps. This figure shows the charge loss due to data retention time as well as the widening of the distributions due to wear-out. Due to the logarithmic scale of the y-axis, it is apparent that the distributions are not symmetric, and the voltages are not normally distributed. While the threshold voltage distributions are often modeled as Gaussian distributions, the measured distributions show an exponential tail toward the lower voltages.

1.2. Parameter Estimation

In order to estimate the measured distributions, a parameter estimation approach presented in [35] may be used. The distributions f(x|Li) are modeled by a piecewise-defined function $$f(x \mid L_i) = \frac{1}{n_i} \cdot \begin{cases} c_i \cdot e^{\lambda_i(x-x_i)} & x < x_i \\ \frac{1}{\sqrt{2\pi\sigma_i^2}} e^{\frac{-(x-\mu_i)^2}{2\sigma_i^2}} & x \geq x_i \end{cases} \quad (1)$$

with $$c_i = \frac{1}{\sqrt{2\pi\sigma_i^2}} e^{\frac{-(x_i-\mu_i)^2}{2\sigma_i^2}}. \quad (2)$$

Let $\varphi(x)$ be the cumulative distribution function of the standard normal distribution, then $$n_i = 1 + \frac{c_i}{\lambda_i} - \phi\left(\frac{x_i - \mu_i}{\sigma_i}\right) \quad (3)$$

ensures the normalization $$\int_{-\infty}^{\infty} f(x|L_i)dx = 1. \quad (4)$$

Figure 3:
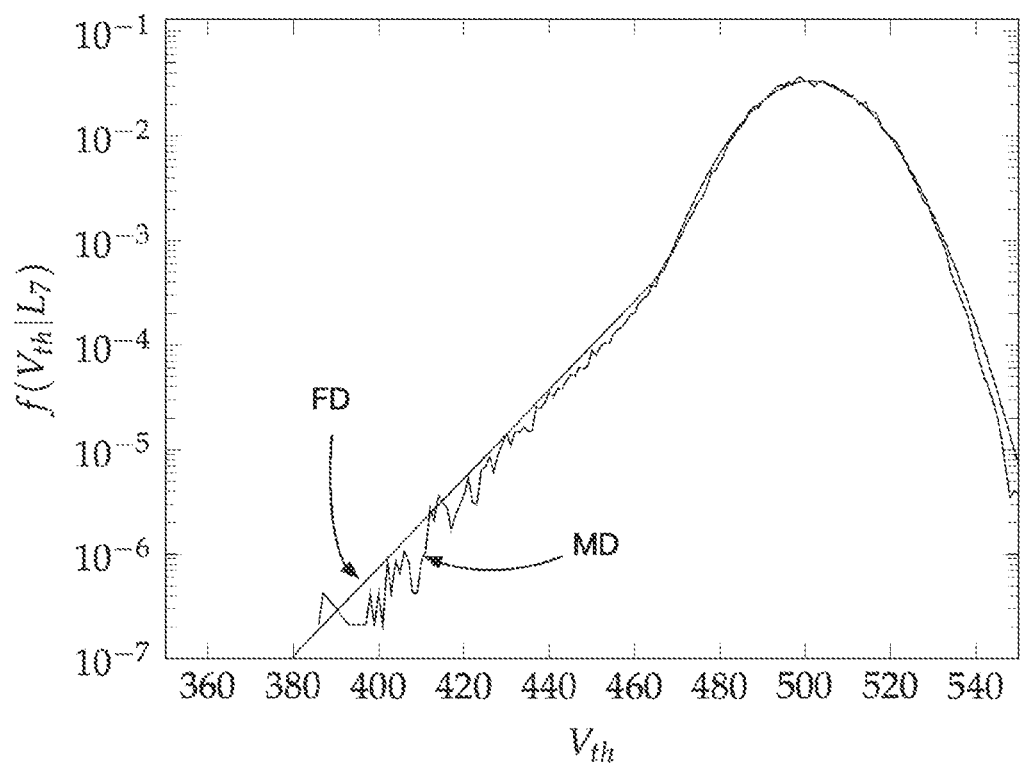
FIG. 3 illustrates an exemplary fitted voltage distribution ($V_{th}|L_7$) of fresh flash memory.

This piecewise-function has four parameters $\sigma_i$, $\mu_i$, $\lambda_i$, and $x_i$. The exponential tail to the left is estimated by an exponential distribution, while the rest of the distribution is modeled as a normal distribution. This allows a precise estimation of the measured distributions, which is reflected by the fitted curve in FIG. 3. This figure shows measurements of the voltage distribution $f(V_{th}|L_7)$ of a fresh memory together with a fitted distribution.

The magnitude of the skewness of the measured distributions is very small. Consequently, the parameters $\sigma^2_i$ and $\mu_i$ can be obtained from the sample mean and the sample variance, because the impact of the exponential tail on the mean and variance can be neglected. For the exponential distribution, a least squares regression line is fitted to the logarithm of the measured distribution. The distributions of the lower states also have an exponential tail towards the higher voltages, which is not modeled as it is negligible compared with the tail to lower voltages.

The curve fitting is used to determine the optimal threshold voltage $V_{opt}(r_i)$ for each read reference voltage $r_i$ such that the bit error probability is minimized, i.e., the optimal threshold voltage is defined as $$V_{opt}(r_i) = \underset{V}{\operatorname{argmin}} \int_V^\infty f(x \mid L_{i-1})dx + \int_{-\infty}^V f(x \mid L_i)dx. \quad (5)$$

1.3. Measurement Data

Note that the measured distributions are also conditioned on life-cycle state, i.e., the number of P/E-cycles and data retention time, amongst many others. Since the distributions may vary over pages and blocks, the page and block numbers are also conditions of the distributions. For simplicity, we omit those conditions in the notation. To obtain the unconditioned distributions, we would need measurements of all possible life-cycle states together with their a priori probabilities, which depend on the usage. The measurements used in the present example are 185 data sets each consisting of one block with 256 pages. The measurements are from eight different samples of the same flash memory model. The blocks were chosen uniformly over all available blocks on the chip. For the life-cycle states, the P/E cycles were measured up to 3000 in steps of 200 cycles. The data retention time simulated by baking was measured at 0, 13, 27, 42, 55, and 83 hours of baking, where 80 hours simulates one year. The value 3000 P/E with 80 hours baking corresponds to the EOL state defined by the manufacturer.

Additionally, measurements of read disturb as well as cross-temperature effects were taken into account. For the read disturb, many read cycles were performed before the measurements. For the cross-temperature effects, the pages were either programmed at a low temperature and read at a high temperature or the other way around. Most data sets combine several effects.

2. Problem Statement and Principal Approach

In this section, measurement results are presented that motivate the proposed calibration method according to the present solution. Particularly, a principal approach for the calibration method is described. Moreover, the information-theoretical measures that are used to analyze and optimize the reference voltage (threshold voltage) calibration are introduced.

The voltage distributions of a flash memory change over the lifetime. Hence, a constant read reference voltage cannot minimize the bit error rate and the number of errors can surpass the error correction capability of the ECC decoder used to decode data read from the memory. To prevent this, the read reference voltage has to be adapted to the current life-cycle state of the flash in order to minimize the bit error rate. In this section, we discuss and analyze the statistical features that are used for the voltage adaptation.

The error correction code is exploited to obtain information about the cell state. Based on the error correction code, the number of errors can be determined and the asymmetry of the error distribution, i.e., the probabilities of 1-to-0 errors and 0-to-1 errors are not equal [20, 27, 29, 38]. In a nutshell, the number of errors provides information about the distance to the optimal threshold and the asymmetry provides information about the direction, i.e., whether to increase or decrease the threshold voltage. Herein, information-theoretic measures are used to investigate the relation between the optimal read reference voltages and the statistical information obtained by counting errors.

2.1. Asymmetric Error Probabilities

In [20, 27, 29, 38], asymmetric error probabilities of the flash channel are reported, i.e., the probabilities of 1-to-0 errors and 0-to-1 errors are not equal. In the measurements considered here, basically two causes for this asymmetry could be found. First, for some charge levels, the asymmetric shape of the threshold voltage distributions causes a certain asymmetry for the bit errors. Secondly, an offset of the reference voltage leads to asymmetric probabilities of 1-to-0 errors and 0-to-1 errors. Further below, the asymmetric error probabilities due to the offsets for the adaptation of the read references will be exploited.

Figure 4:
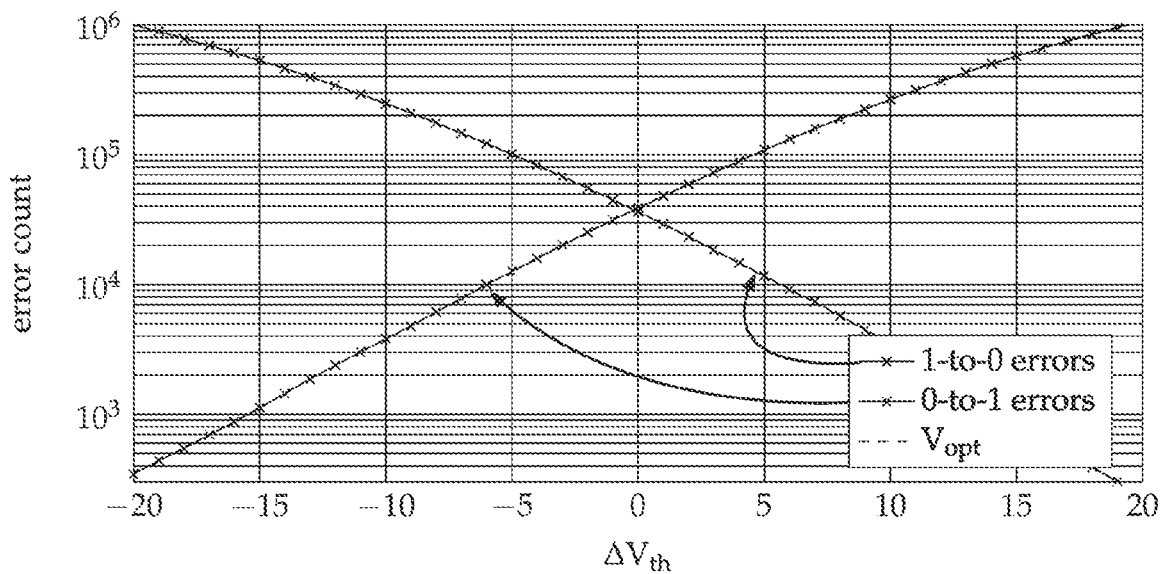
FIG. 4 illustrates an exemplary error count for 1-to-0 errors and 0-to-1 errors versus the (level of the) threshold voltage for a reference voltage $r_3$ at EOL (end of life) of the NVM.

The asymmetric error probabilities are indicated in FIG. 4 which shows an example of the number of errors for 1-to-0 errors and 0-to-1 errors. This figure considers reference voltage $r_3$ at an EOL scenario. The error probabilities are balanced for the optimal threshold voltage which is indicated by the value $\Delta V_{th}=0$, whereas the asymmetric error counts for other voltages can be exploited for the threshold adaptation. As shown in FIG. 2 the higher distributions are highly asymmetric for early-life cases.

Figure 5:
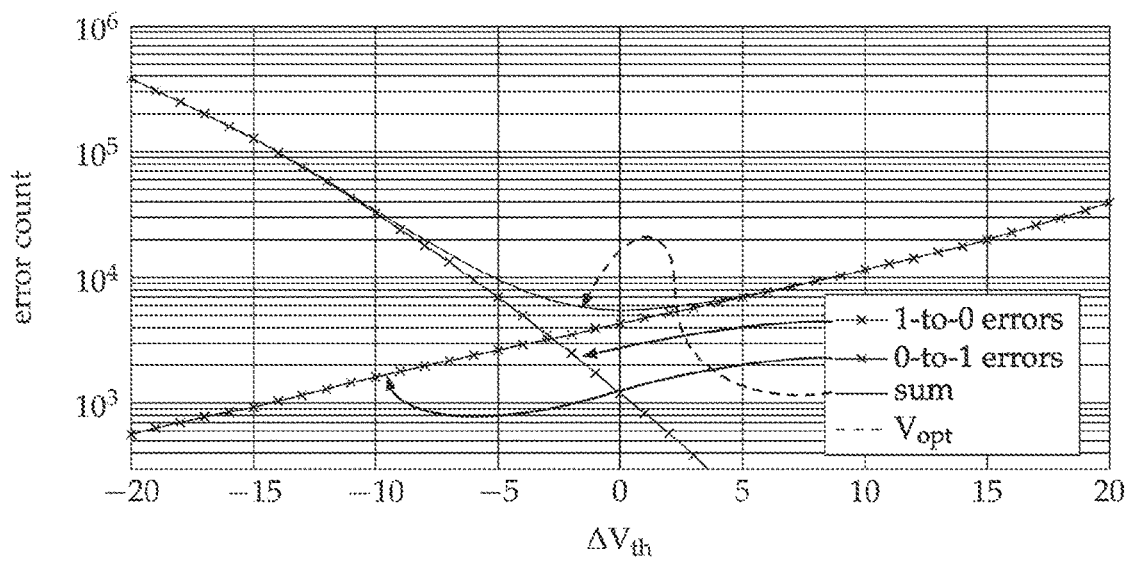
FIG. 5 illustrates an exemplary error count for 1-to-0 errors and 0-to-1 errors versus the (level of the) threshold voltage for a reference voltage r7 of fresh flash memory.

FIG. 5 shows the error count for 1-to-0 errors, 0-to-1 errors, and the overall error count for reference $r_7$ for a fresh memory block. It can be seen that the error probabilities are asymmetric at the optimal threshold voltage indicated by the value $\Delta V_{th}=0$, which needs to be considered for voltage adaptation.

2.2. Number of Errors

Typically, different error correction codes are applied for the user-data and for meta data. Along with the payload data (user-data), a flash controller stores meta information about the life-cycle state, e.g., the number of P/E cycles. Typically, the meta data is protected by a significantly better error correction code than the payload data. Hence, it is possible to correct the errors in the codeword of the meta ECC even at a relatively large offset in the level of the reference voltage.

Figure 6:
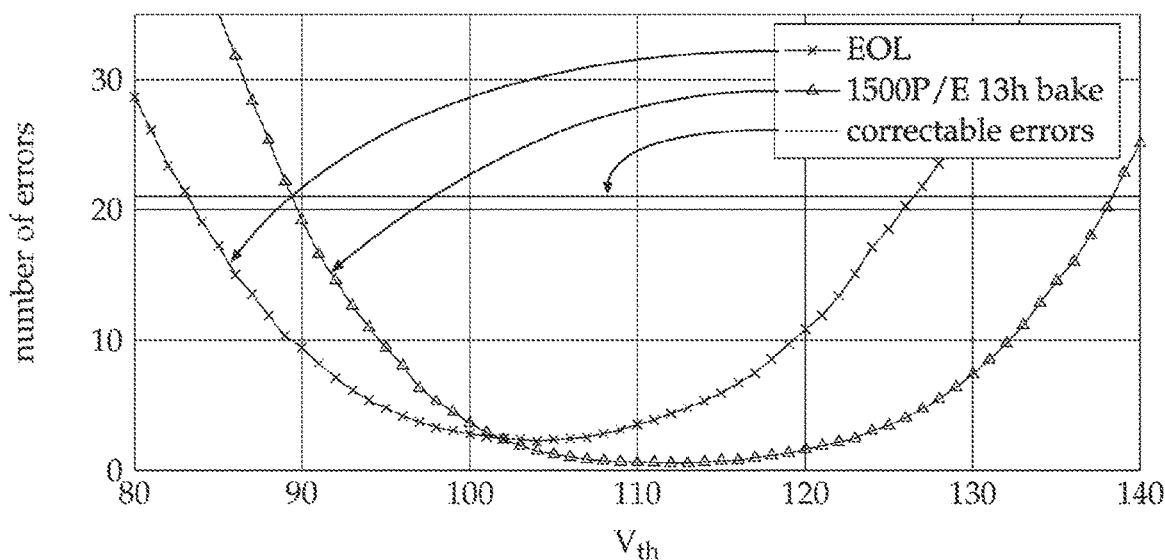
FIG. 6 illustrates an exemplary number of errors in meta-data read-out from an NVM over the (level of the) threshold voltage.

FIG. 6 illustrates a number of errors in the meta-data versus the read threshold (level of read reference voltage) at different life-cycle states. Now a code with length n=508 is considered that can correct up to t=21 errors. The horizontal line in FIG. 6 indicates the maximum number of correctable errors. The number of errors for a given voltage provides information about the flash aging. For instance, consider the value $V_{th}=120$. For the EOL condition, 11 errors are observed on average, whereas the expected number of errors for 1500 P/E cycles is only about two. Hence, the observed number of errors enables a prediction of the offset to the optimal read voltage. However, the provided information depends on $V_{th}$. It can be seen in FIG. 6 that the slope of the error curves is very low near the optimum. When threshold voltages close to the optimal voltage $V_{opt}$ are applied, only little information is gained by the number of errors. On the other hand, if the offset between $V_{th}$ and $V_{opt}$ is too large, then the read data is likely to be undecodable.

The mutual information between the optimal reference voltage $V_{opt}$ and the observed number E of errors can now be used to measure the information that is gained by counting errors.

2.3. Mutual Information

Next, the information that is obtained by counting the number of errors in the read codewords is investigated. Further below, the shift of the read reference voltages based on the number of observed errors in the read codeword will be predicted. In addition to the total number of errors, the asymmetry between 0-errors and 1-errors may be exploited.

Information theoretic measures are now used to investigate the relation between the optimal read references (i.e., read reference voltage levels) and the statistical information obtained by counting errors. In particular, the mutual information is considered. The mutual information I(X;Y) of two random variables is a measure for the information gained about one variable when knowing the other variable an may be expressed in bits. Let X and Y be two random variables with $X \in \{x_1, x_2, \ldots, x_N\}$ and $Y \in \{y_1, y_2, \ldots, y_M\}$ with probability distributions $f_X(x_i)$ and $f_Y(y_i)$ and joint probability distribution $f_{XY}(x_i, y_j)$. The mutual information between X and Y may be defined as [39]

$$I(X;Y) = \sum_{i=1}^{N} \sum_{j=1}^{M} f_{XY}(x_i, y_j) \cdot \log_2\left(\frac{f_{X|Y}(x_i \mid y_j)}{f_X(x_i)}\right). \quad (6)$$

The mutual information is non-negative and upper bounded by the minimum of the entropies of the two variables [39]. For practical applications, it can have advantages using other measures, e.g., the residual error rate of a given decoder. But those measures are very specific to a given implementation.

Figure 7:
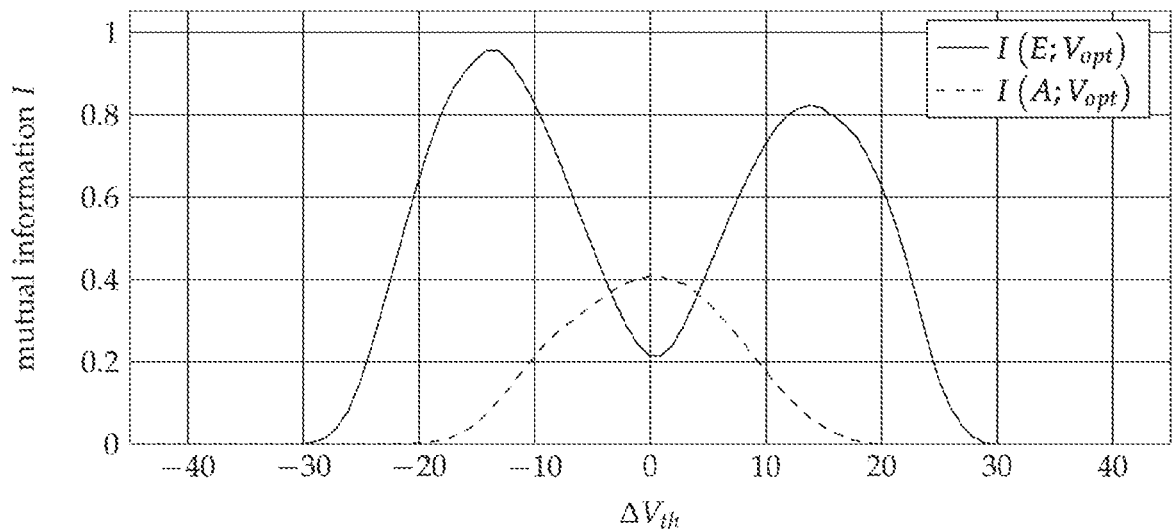
FIG. 7 illustrates an exemplary curve representing mutual information between number of errors or the binary variable A and the optimal voltage level (threshold voltage) for reference voltage $r_3$ over read voltage.

FIG. 7 shows the mutual information $I(E; V_{opt})$ between the optimal reference voltage $V_{opt}$ and the observed number of errors E. The mutual information is determined over different life-cycle states. As a second observation, consider a binary random variable A which indicates the direction of the asymmetry between 0-to-1 errors and 1-to-0 errors. A=1 indicates more 1-to-0 errors and A=0 indicates more 0-to-1 errors.

The mutual information $I(A; V_{opt})$ is also depicted in FIG. 7. Note that this figure shows the curves for reference $r_3$.

When using the number of errors in the meta data one gets the maximum information about the optimum reference when reading at about −14, i.e., 14 voltage steps lower than the mean optimum voltage reference level. One can see that near the optimum the mutual information is fairly low, which is due to the fact that the entropy of the number of errors is low in that region. Reading far from the optimum ($|\Delta Vth| \geq 30$), one obtains no information about $V_{opt}$, because the read data is not decodable (correctable). In the case of a decoding failure, the exact number of errors remains unknown. Near the optimum $\Delta V_{th}=0$, one can see that the binary variable A that indicates the asymmetry provides more information about $V_{opt}$ than the number of errors E.

The asymmetry for higher charge values shown in FIG. 5 also leads to an asymmetry in the mutual information. This can be seen in FIG. 8, where the mutual information versus the read voltage is plotted for reference $r_7$. As one can see, the maximum of the mutual information between the asymmetry A and the optimum threshold voltage is not at $\Delta V_{th}=0$. Similarly, the local minimum for $I(E; V_{opt})$ does not occur at $\Delta V_{th}=0$.

2.4. Principal Approach

In the following, two adaptation processes are considered which depend on the a priori knowledge about the life-cycle state of the considered memory block. First, a calibration process (relating to the calibration method of the first aspect) aims at finding a good reference threshold (level of a read reference voltage) with a small number of read attempts, particularly when no knowledge about the life-cycle state is available. Second, a tracking process (relating to the tracking process of certain embodiments of the calibration method), based on a gradual channel estimation method, adjusts the read threshold while iterating over successive pages, i.e., the first page of a block is calibrated and sequentially other pages from the same block are read.

The tracking process will typically apply only small changes to the read reference voltage, because adjacent pages in a block typically have similar distributions. On the other hand, a tracking algorithm should be as time efficient as possible, whereas the calibration may require multiple reads and voltage adjustment steps, which may become more time intensive. When some knowledge about the life-cycle state is available, this information may be used to update the reference voltage without any additional reads. The proposed methods are also motivated by the above observations about the mutual information. The number of errors in the meta-data is used here for the calibration, because it provides information about $V_{opt}$ over a relatively wide range of read voltages $V_{th}$. On the other hand, a tracking process based on the asymmetry of 0-to-1 and 1-to-0 errors is used, since the asymmetry has a higher mutual information for voltages near to the optimum, where the total number of errors provides little information.

3. Calibration of the Read Reference Voltages

This section provides a discussion of embodiments of the method of the first aspect, namely a data-driven calibration method to predict the optimal level of the reference voltage (threshold voltage) without any previous knowledge of the NVM (e.g., flash) life-cycle state. The observed number of errors in a codeword for the meta-data is exploited under the assumption that the ECC for meta-data is stronger than the ECC used for the payload data (user-data). Hence, the voltage range that allows for successful decoding is larger.

For the calibration, we determine a reference voltage level (threshold voltage) $V_0$ for the first reading over all available (i.e., in available measurement data) life-cycle states. Accordingly, $V_0$ serves as an initial voltage level for the calibration process. This voltage $V_0$ is obtained by maximizing the mutual information between the number of errors and the optimum threshold voltage over all data sets. Consider FIG. 7 for exemplary reference $r_3$, where the best voltage $V_0$ is at $V_{th}=-14$. The analysis of the mutual information is done for each considered reference voltage.

First, the meta-data are read at the threshold voltage $V_0$ for reference $r_3$ and decoded. In the case of successful decoding, the number of errors is known and can be used to adapt the threshold voltage for reading the user-data. This adaptation is done using a simple look-up in a table, which specifies a voltage offset for a given number of observed errors. The calculation for this table is described further below. In the case of a decoding failure, a read-retry mechanism may be applied. The threshold voltage is adapted and read the meta-data again. For this second adaptation step, the same analysis of mutual information is performed but using only data sets of the pages, where the meta-data were not correctable at $V_0$. Again, the particular threshold voltage is selected, which maximizes the mutual information between the number of errors and the optimum threshold voltage. Often, a number of two read trials will be sufficient for the calibration. In general, the maximum number of read-retries will depend on the error correction capability of the ECC. The number of errors in the meta-data is used to adapt the threshold voltage, which is then used to read the user-data. To obtain the best threshold voltage given a specific number of errors, a look-up table (LUT) filed with a data-driven approach may be used.

To determine the look-up table for the adaptation, the data sets of the measurements are clustered based on the number of errors in the meta-data when reading at the initial voltage level $V_0$. The number of clusters is determined by the error correction capability t of the ECC. There are t+1 clusters, one for every possible number E of errors, obtained based on the number of errors observed in each page. For each cluster, a representative (cluster centroid) is determined by minimizing the Euclidean distance of the representative to all samples in the cluster or the mean bit error rate (BER) in the cluster.

Figure 9:
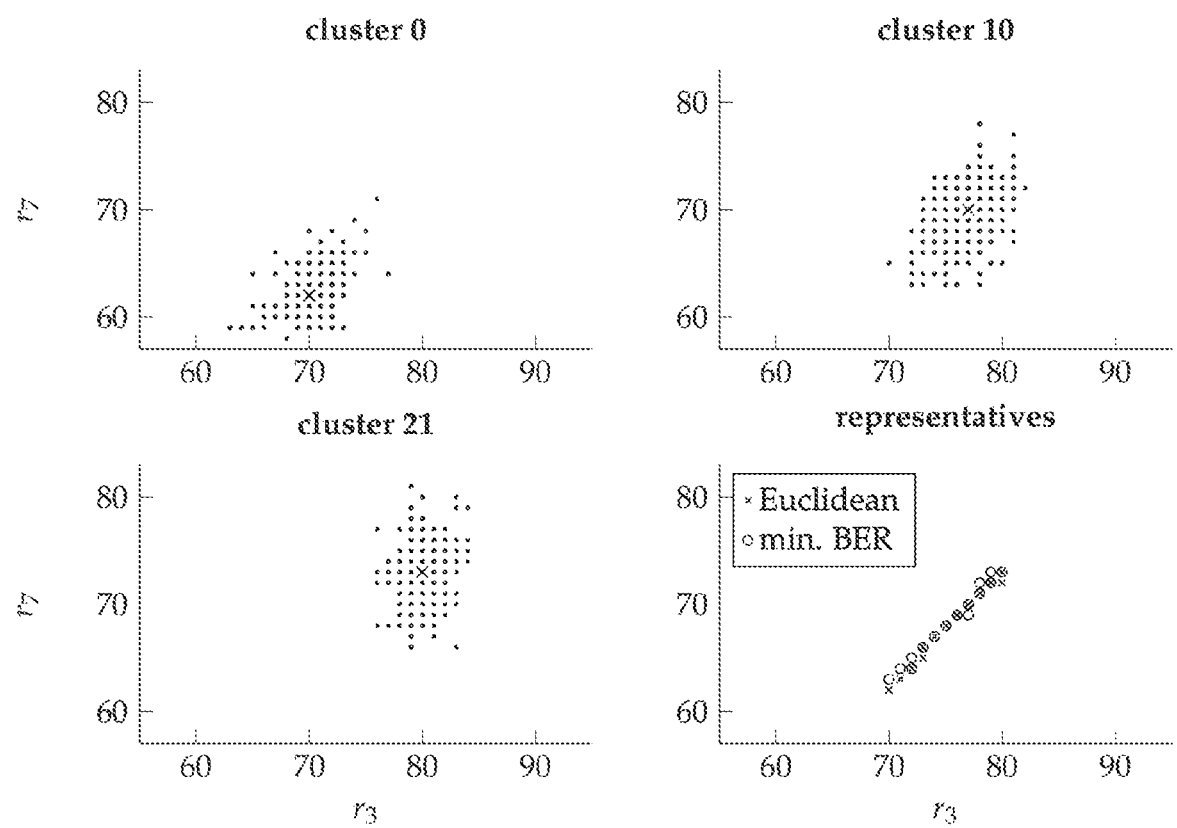
FIG. 9 illustrates exemplary clusters for filling a look-up table, LUT (calibration table)

FIG. 9 shows exemplarily clusters for 0, 10, and 21 errors, respectively, in the meta-data of an MSB page. Referring to the bit mapping in FIG. 1, the MSB page is defined by references $r_3$ and $r_7$. In the clusters in FIG. 9, the respective optimum threshold voltage for the reference $r_7$ is plotted versus the optimum threshold for reference $r_3$. Each point depicts a possible pair of optimal voltages that was observed in exemplary measurements for a given number of errors in the meta-data. The small crosses in the plots for the three clusters, indicate the representatives of the clusters.

The lower right-hand quadrant of FIG. 9 shows the representatives of all clusters obtained by minimizing the Euclidean distance or by minimizing the mean bit error rate (BER) in the cluster, respectively. It is observed that both ways to determine the representatives achieve similar results. Since $V_0$ is typically lower than $V_{opt}$ (cf. FIG. 7), a higher error count leads to larger predicted threshold voltage of the representative.

Figure 10:
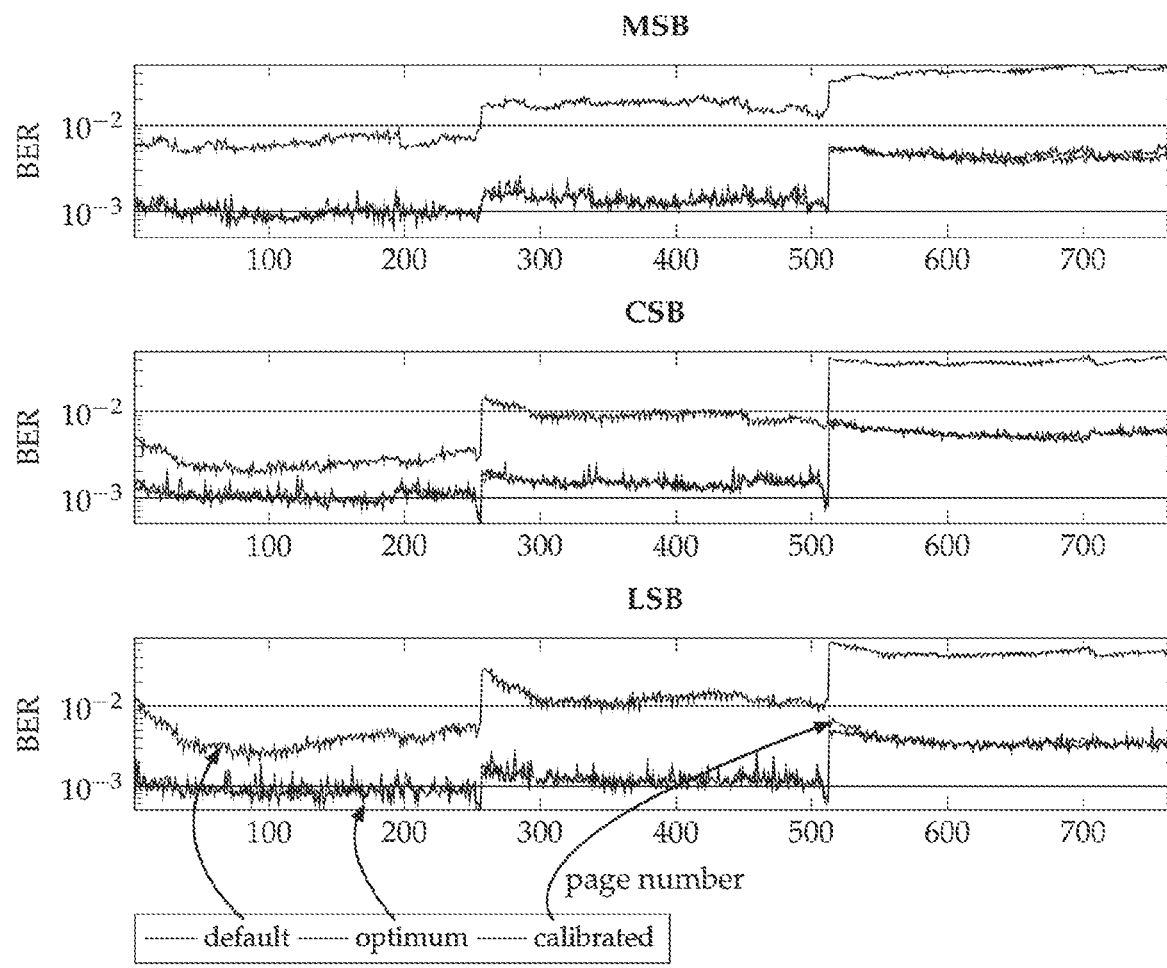
FIG. 10 illustrates exemplary residual BER resulting from the proposed calibration method compared to minimum BER.

FIG. 10 shows the results of this calibration method for three different life-cycle states. The x-axis shows the page number and the y-axis the bit error rate (BER) when reading at (i) the default threshold voltage (for each page the upper line). (ii) the optimum threshold voltage for each page, and (iii) the calibrated threshold voltage resulting from the calibration method.

Each data set consists of 256 pages. The page numbers from 1 to 256 correspond to 1500 P/E cycles and 13 hours baking. The pages from 257 to 512 consider 1500 P/E cycles and 80 hours baking. The last 256 pages correspond to 3000 P/E cycles and 80 hours of baking (EOL).
The default threshold voltage is constant and only suitable for fresh flash memories, which is not shown in this figure, because typically no calibration is required. The optimum threshold voltage is calculated for each page individually using the measurements.

While the calibration typically does not result in the optimum threshold voltage for each page, the BER is very close to the minimum possible error rate. Hence, this method provides a sufficiently precise calibration. However, it might require up to two times reading the meta-data and up to three times changing the threshold voltage, which might lead to a relatively high overall latency. In the next section, a tracking process is described, which reduces the latency for the threshold adaption of the remaining pages of a memory block.

4. Tracking the Read Threshold

As described before, each page of a flash block has a specific readout threshold voltage $V_{opt}$ at which the lowest number of errors is observed. Unfortunately, these voltages may vary from page to page of the same block even when all pages have the same life-cycle condition.

Figure 11:
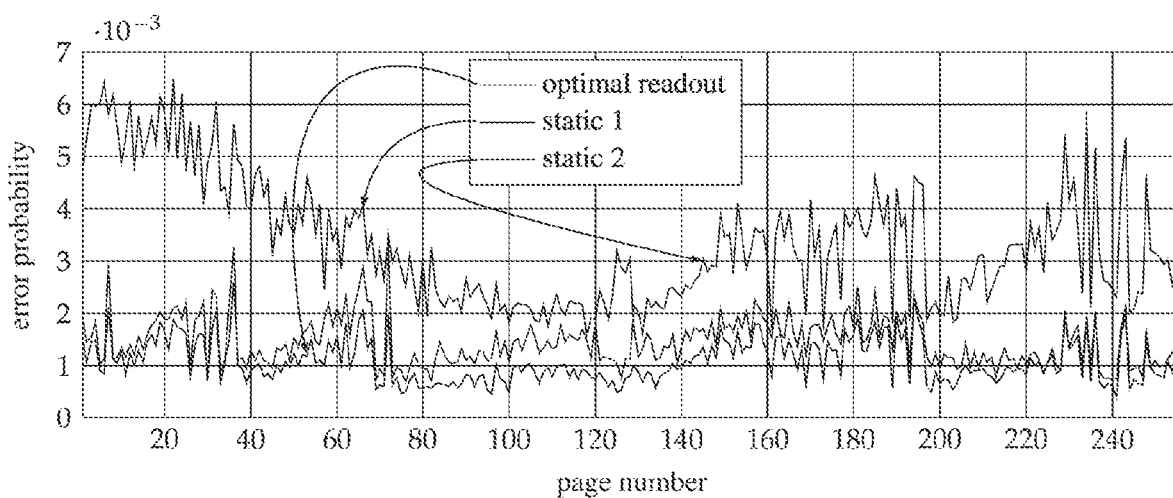
FIG. 11 illustrates exemplary an error probability curve of a TLC block on reference voltage r7 (55 h bake, 3000 P/E) for an optimal readout and for two worst case static readouts.

This is illustrated in FIG. 11, which shows an exemplary error probability of each page of a single TLC block for reference $r_7$ with 3000 P/E-cycles and 55 hours of baking. Note that the error rate at reference $r_7$ is not equal to the BER of the MSB page, because the MSB page uses references $r_3$ and $r_7$ (cf. FIG. 1).

In FIG. 11, the curve labeled by optimal readout indicates the smallest possible error probability for each page using the individual $V_{opt}$ values. The two other curves correspond to two static threshold voltages. For the curve "static 1", the read reference was calibrated at the end of the block, whereas threshold voltage corresponding to the curve "static 2" was calibrated at the beginning of the block. As shown in FIG. 11, the static threshold voltages lead to significantly higher bit error rates.

The previous example shows that constant reference voltages for a complete block can cause a considerable performance degradation. To cope with this problem, a tracking process for the reference voltages for consecutive pages may be used, as described in the following: It is assumed that a near-optimal threshold voltage of the first page of the block is acquired by the calibration algorithm described in section 3 above (or more generally, the method of the first aspect).

As shown in FIG. 4, the optimal threshold voltage corresponds to a balanced error probability for 1-to-0 errors and 0-to-1 errors. The binary variable A indicates the direction of the asymmetry between 0-errors and 1-errors. A=1 indicates more 1-to-0 errors and A=0 indicates more 0-to-1 errors. Hence, A also provides the direction for the voltage change toward the equilibrium of the error probabilities.

Figure 12:
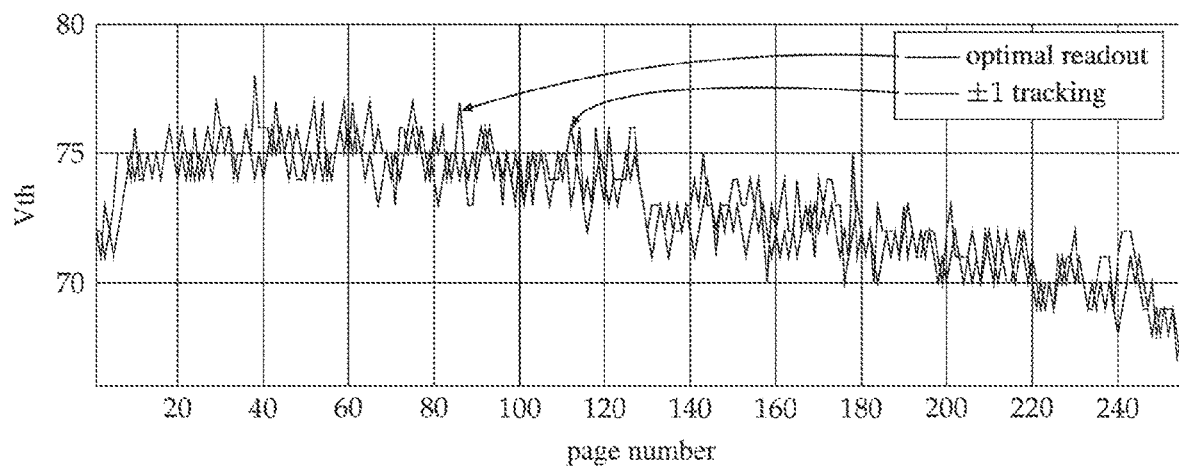
FIG. 12 illustrates exemplary reference voltage (threshold voltage) adaptation of a TLC-block for reference voltage r3 (55 h bake, 3000 P/E)

A simple embodiment of the tracking process adapts the threshold voltage for the next page by a ±1 voltage step depending on A. This concept is illustrated in FIG. 12, which depicts the adaptation of the threshold voltages over one block for reference $r_3$. The curve "optimal readout" shows the values of $V_{opt}$ for each page. The curve "±1 tracking" presents the results with tracking, where ±1 voltage steps are applied. One can observe that the adaptation closely follows (i.e., approximates) the optimal voltage values.

Figure 8:
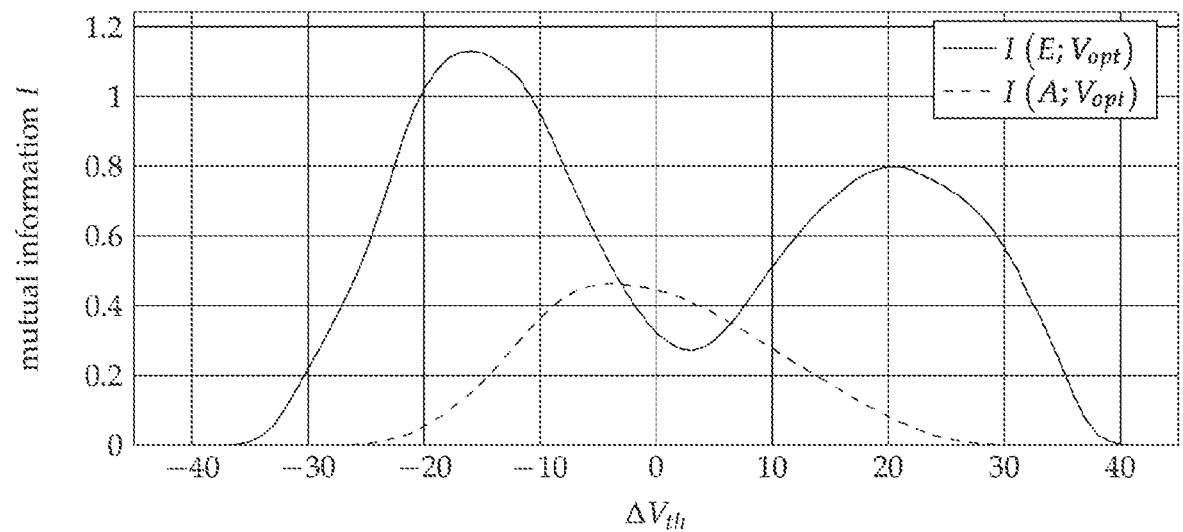
FIG. 8 illustrates an exemplary curve representing mutual information between number of errors or the binary variable A and the optimal level (threshold voltage) for reference voltage r7 over read voltage.

However, the equilibrium of the error probabilities does not always coincide with $V_{opt}$. This is indicated in FIG. 5 and FIG. 8. For instance, in FIG. 5 the equilibrium of the error probabilities corresponds to the value $\Delta V_{th}$, =−3. In such a case, the tracking towards the equilibrium results in a bias, i.e., the estimated voltages systematically overestimate or underestimate $V_{opt}$.

Figure 13:
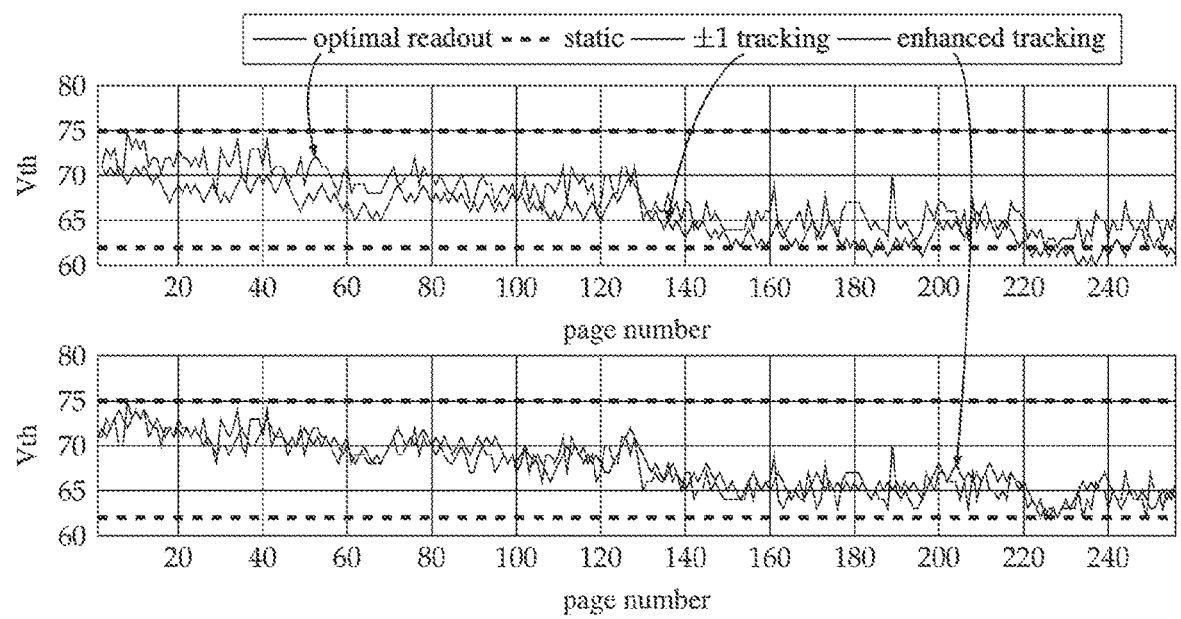
FIG. 13 illustrates exemplary reference voltage (threshold voltage) adaptation of a TLC-block for reference voltage r7 (55 h bake, 3000 P/E)

This effect is illustrated in the upper part of FIG. 13. This figure shows the adaptation of the threshold voltages over one block for reference $r_7$. The dashed lines correspond to the static voltages from FIG. 11 and the solid line "optimal readout" shows the values of $V_{opt}$ for each page. The curve "±1 tracking" depicts the results with a tracking, where ±1 voltage steps are applied. One can observe that the adaptation follows the optimal voltage values, but diverges slightly from the optimal curve, where $V_{opt}$ is mostly underestimated. On average, the bias corresponds to the shift $\Delta V_{th}=-3$ of the equilibrium.

In such a case, an enhanced tracking algorithm can be applied that corrects this bias. Instead of changing the value of A at the equilibrium of the error probabilities, the ratio of the number of errors that corresponds to the optimal voltage $V_{opt}$ or the shift $\Delta V th=0$, respectively. For instance, in FIG. 5 the number of 1-to-0 errors is about four times the number of 0-to-1 errors. In this case, the value of A can be defined such that A=1 indicates four times more 1-to-0 errors than 0-to-1 errors.

Figure 14:
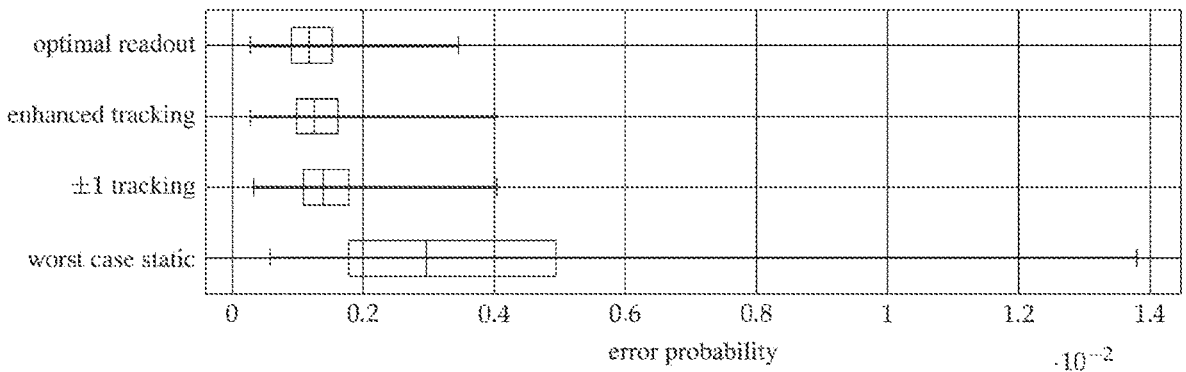
FIG. 14 illustrates exemplary error statistic for reference voltage r) of all pages of 27 blocks (55 h bake, 3000 P/E)

To average the ratio over different life-cycle states, the ratio that corresponds to the value $\Delta V_{th}=0$ for the mutual information I interquartile range, i.e., the interval for 50% of all measurements when ordered from lowest to highest error probability, may be chosen, as illustrated in FIG. 14. The whiskers represent the most extreme data points without outliers. The box plots consider (i) the simple ±1 voltage adaptation, (ii) the enhanced adaptation, and (iii) the worst-case static readout voltages. For every block in the data set, the worst-case readout voltage was selected within the range of optimal readout voltages. Hence, these values correspond to an optimal readout voltage of one page within a block, which was selected as static readout voltage for the entire block.

The results in FIG. 14 show that a static readout voltage can significantly increase the error probability compared with the optimal voltage. The ±1 adaptation and the enhanced adaptation obtain a similar performance which is close to the optimal read voltage. Consequently, while the bias compensation is not always critical with respect to the achievable error rate, it might be required for soft-input decoding [15,19]. Many soft-input decoding algorithms assume quantization intervals that maximize the mutual information between the input and output of flash memory, which requires an accurate voltage adaptation.

Figure 15:
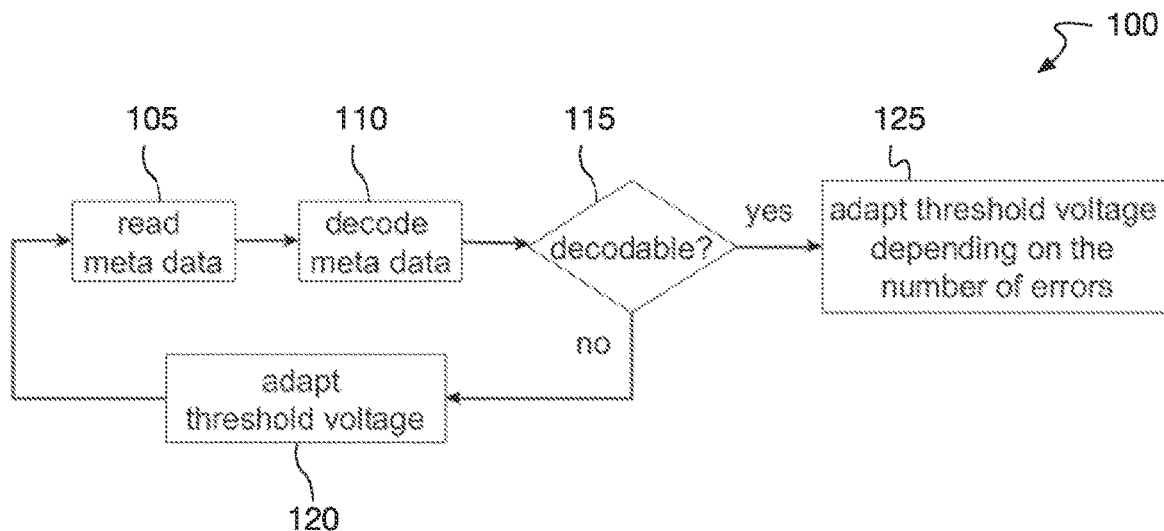
FIG. 15 illustrates an exemplary embodiment of the calibration method.

FIG. 15 illustrates an exemplary embodiment 100 of the calibration method and aims at finding a near-optimum read threshold voltage (i.e., reference voltage level) based on the number of errors in a small amount of meta-data (e.g., the codeword of the error correcting codes for the meta information).

The method 100 starts, when the threshold voltage is set (before or as part of the method) to a predefined initial voltage level $V_0$. Then, in a step 105, meta-data is read from the NVM and decoded, i.e., ECC-decoded, in a further step 110. Whether the decoding in step 110 is successful depends particularly on the number E of errors.

If E is or becomes greater than the maximum number $E_{max}$ of errors the ECC can decode, the decoding will fail (115—no) and in a subsequent further step 120, the threshold voltage will be adapted, and the process will be repeated at step 105 based on the adapted threshold voltage. This adaptation may particularly be made by applying a predefined voltage step to $V_0$, or by changing the threshold voltage to a predefined next voltage level $V_1$, (and then $V_2$, if the decoding at $V_1$ still fails and thus a further adaptation becomes necessary etc.).

If E is or becomes equal or less than $E_{max}$, the decoding will be successful (115—yes) and in a subsequent further step 125, the threshold voltage will be set depending on the number of errors E found during the successful decoding. Step 125 may particularly make use of a predetermined look-up table, LUT, which defines near-optimal or even optimal threshold voltage levels as a function of the number E of errors. An exemplary process for determining the LUT will be discussed below with reference to FIG. 17. Now, after completion of step 125, payload data may be read from the NVM by applying the adapted threshold voltage level resulting from calibration method 100.

Figure 16:
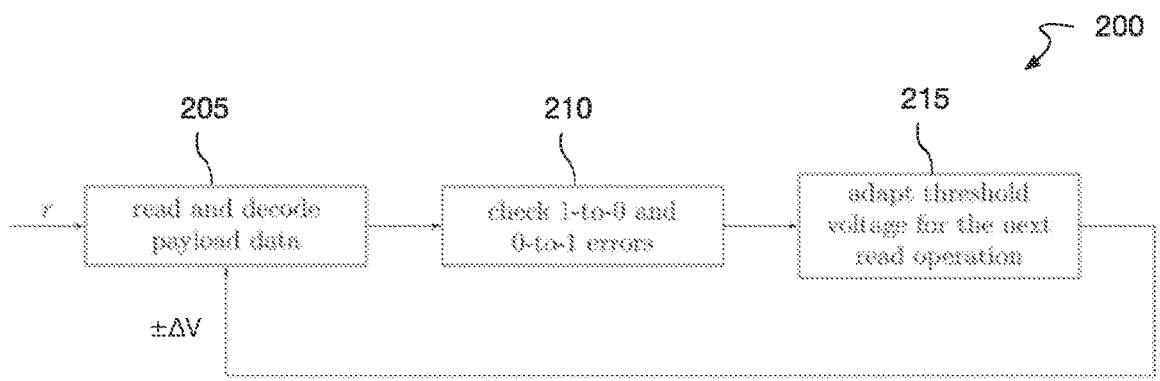
FIG. 16 illustrates an exemplary embodiment of a tracking process to be used in connection with the calibration method.

FIG. 16 illustrates an exemplary embodiment 200 of a tracking process to be used in connection with the calibration method. Particularly, it may be used within calibration method 100 of FIG. 15 as an additional process that follows step 125. The process 200 is based on the concept of (further) adapting the read threshold voltage level based on an observed symmetry or asymmetry of the number of 1-to-0 and 0-to-1 errors in the payload data.

The tracking process 200 is initialized by setting a target probability (e.g., the binary variable A discussed above) for the asymmetry or symmetry of 1-to-0 and 0-to-1 errors for each read reference voltage, i.e., equal probability for normal references voltages with symmetric voltage distributions, and a probability offset for special reference voltages with asymmetric voltage distributions. The initialization may further comprise setting a size of voltage step $\Delta V > 0$.

Then, the tracking itself may begin with a step 205 by reading and decoding payload data. Count number of 1-to-0 and 0-to-1 errors during the decoding. The reading is based on the calibrated voltage reference level, for each reference voltage r, as provided by the calibration method, e.g., in step 125 of method 100. In a further step 210, the number of 1-to-0 errors and the number of 0-to-1 errors are determined. If the number of 0-to-1 errors is larger than indicated by the target probability A, the threshold voltage is shifted by voltage step $\Delta V$ for the next read and decode operation towards the state encoding the bit value 1. Else, i.e., if the number of 1-to-0 errors is larger than indicated by the target probability A, the threshold voltage is shifted by voltage step $\Delta V$ for the next read and decode operation 205 of payload data towards the state encoding the bit value 0. This iterative process is continued until step 210 determines that a predefined exit criterion is reached. Particularly, the exit criterion may be defined as an equilibrium (ratio 1:1) of the number of 0-to-1 errors and the 1-to-0 errors, as indicated by A=1.

Figure 17:
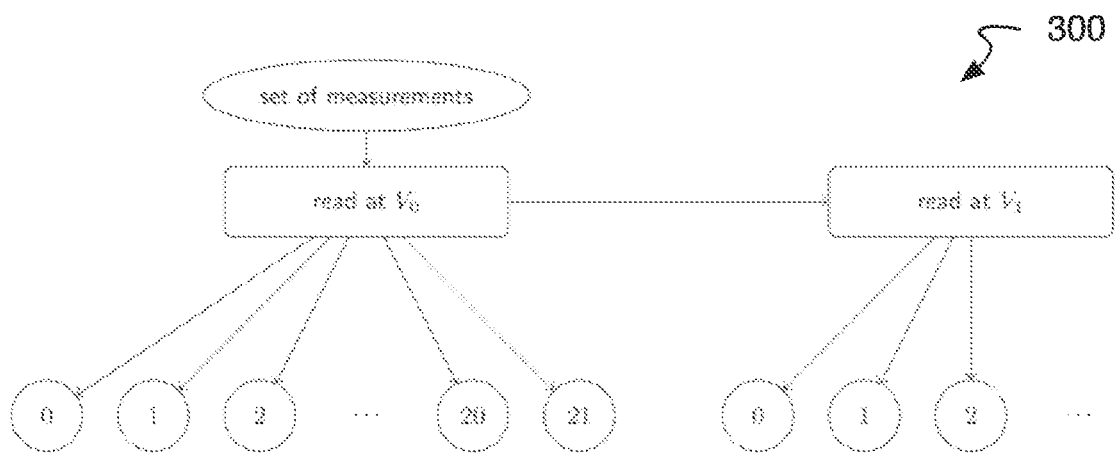
FIG. 17 illustrates an exemplary embodiment of a LUT-generation process for generating a LUT for use in certain embodiments of the calibration method.

FIG. 17 illustrates, together with FIG. 9, a top-level view of an exemplary embodiment of a LUT-generation process 300 for generating a LUT for use in certain embodiments of the calibration method. The process 300 is based on the idea of computing an LUT with near optimum threshold voltages for each possible number of errors in the meta-data given a representative set of measurements. The table stores the best-known threshold voltage for each read reference voltage depending on the number of errors observed in the meta-data (e.g. 0 to 21 errors).

Process 300 uses the following parameters for its configuration:
$E_{max}$ error correction capability of meta-ECC (e.g., 21)
numReads max. number of reads (e.g., 2)
$V_i$ predefined threshold voltages for each reference and read Process 300 comprises:
1. For each page in the measurement data, determining the optimal read reference voltages that minimize the bit error probability for all bit decisions;
2. For each read reference voltage i, determining the voltage $V_i$ that maximizes the mutual information over the complete set of all measurements between the number of errors in the meta-data and the optimal read reference voltages;
3. For each page in the measurement data, determining the number of errors in each page's meta-data when reading at $V_i$;
4. Determining data for the calibration look-up table:
   a. Clustering pages according to number of errors in the meta-data;
   b. Merging all clusters corresponding to at least $E_{max}$ errors;
   c. For each cluster and reference: Calculating the calibration thresholds as the geometrical centroid of all optimal read reference voltages observed in the same cluster,
   d. For each cluster (all possible numbers of errors in the meta-data), filling one line in the calibration table with the calculated calibration thresholds.

Figure 18:
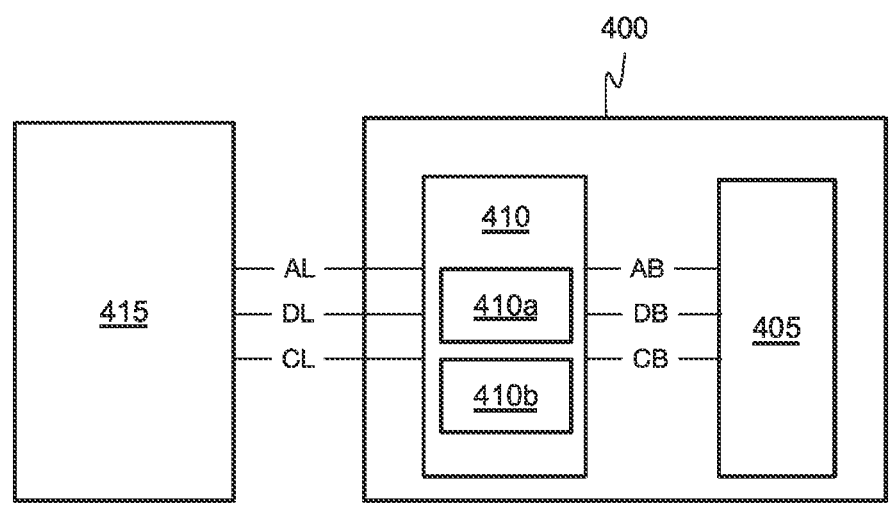
FIG. 18 illustrates an exemplary embodiment of a NVM memory controller being configured to perform the calibration method, optionally including the tracing process.

FIG. 18 illustrates an exemplary embodiment of a memory system 400 being connected to a host 415 and comprising an NVM 405 and a memory controller 410 for controlling the NVM 405. The memory controller (NVM controller) 410 may particularly be a flash controller, if the NVM is or comprises flash memory, e.g., of the NAND type.

The memory system 400 is connected to host 415, such as a computer to which the memory system 400 pertains, via a set of address lines AL, a set of data lines DL, and a set of control lines CL. The memory controller 405 comprises a processing unit 405a and an internal memory 405b, typically of the embedded type, and is connected to NVM 405 via an address bus AB, a data bus DB, and a control bus CB. Accordingly, host 415 has indirect read and/or write access to the NVM 405 via its connections AL, DL and CL to the memory controller 405, which in turn can directly access NVM 405 via the buses AB. DB and CB. Each of the set of lines respectively buses AL, DL, CL, AB, DB and CB may be implemented by one or more individual communication lines. Bus AB may also be absent.

Memory controller 405 is configured to perform the calibration method 100, optionally including the tracking process 200, in relation to NVM 405. To that purpose, memory controller 405 may comprise a computer program residing in its internal memory 410b which is configured to perform one or more of these methods when executed on the processing unit 410a of memory controller 405. Alternatively, the program may for example reside, in whole or in part, in NVM 405 or in an additional program memory (not shown) or may even be implemented in whole or part by a hard-wired circuit.

While above at least one exemplary embodiment of the present invention has been described, it has to be noted that a great number of variations thereto exist. Furthermore, it is appreciated that the described exemplary embodiments only illustrate non-limiting examples of how the present invention can be implemented and that it is not intended to limit the scope, the application or the configuration of the herein-described apparatuses and methods. Rather, the preceding description will provide the person skilled in the art with constructions for implementing at least one exemplary embodiment of the invention, wherein it must be understood that various changes of functionality and the arrangement of the elements of the exemplary embodiment can be made, without deviating from the subject-matter defined by the appended claims and their legal equivalents.

LIST OF REFERENCE SIGNS

- 100 calibration method
- 105-125 steps of method 100
- 200 tracking process
- 205-115 steps of tracking process 100
- 300 LUT-generation process
- 400 memory system
- 405 NVM, e.g. flash memory
- 410 memory controller, e.g. flash controller
- 410a processing unit of memory controller 405
- 410b internal memory 405b of memory controller 405
- 415 host
- AL set of address lines
- DL set of data lines
- CL set of control lines
- AB address bus
- DB data bus
- CB control bus CB

REFERENCES WHICH ARE INCORPORATED HEREIN BY REFERENCE FOR ALL PURPOSES

1. Micheloni, R.; Marelli, A.; Ravasio, R. *Error Correction Codes for Non-Volatile Memories*; Springer, 2008.

2. Spinelli, A. S.; Compagnoni, C. M.; Lacaita, A. L. Reliability of NAND Flash Memories: Planar Cells and Emerging Issues in 3D Devices. *Computers* 2017, 6. doi: 10.3390/computers6020016.

3. Dolecek, L.; Cassuto, Y. Channel Coding for Nonvolatile Memory Technologies: Theoretical Advances and Practical Considerations. *Proceedings of the IEEE* 2017,105, 1705-1724. doi:10.1109/JPROC.2017.2694613.

4. Zhang, X.; Parhi, K. K. High-speed architectures for parallel long BCH encoders. IEEE *Transactions on Very Large Scale Integration (VLSI) Systems* 2005, 13, 872-877.

5. Freudenberger, J.; Spinner, J. A configurable Bose-Chaudhuri-Hocquenghem codec architecture for flash controller applications. *Journal of Circuits, Systems, and Computers* 2014, 23,1-15.

6. Dong, G.; Xie, N.; Zhang, T. On the Use of Soft-Decision Error-Correction Codes in NAND Flash Memory. *IEEE Transactions on Circuits and Systems 1: Regular Papers* 2011, 58, 429-439.

7. Cho, S.; Kim, D.; Choi, J.; Ha, J. Block-Wise Concatenated BCH Codes for NAND Flash Memories. *IEEE Transactions on Communications* 2014, 62, 1164-1177. doi:10.1109/TCOMM.2014.021514.130287.

8. Spinner, J.; Freudenberger, J.; Shavgulidze, S. A Soft Input Decoding Algorithm for Generalized Concatenated Codes. *IEEE Transactions on Communications* 2016, 64, 3585-3595.

9. Spinner, J.; Rohweder, D.; Freudenberger, J. Soft input decoder for high-rate generalised concatenated codes. *IET Circuits, Devices Systems* 2018, 12, 432-438. doi: 10.1049/iet-cds.2017.0347.

10. Rajab, M.; Freudenberger, J.; Shavgulidze, S. Soft-input Bit-flipping Decoding of Generalized Concatenated Codes for Application in Non-volatile Flash Memories. *IET Communications* 2018.

11. Zhao, K.; Zhao, W.; Sun, H.; Zhang, X.; Zheng, N.; Zhang, T. LDPC-in-SSD: Making Advanced Error Correction Codes Work Effectively in Solid State Drives. Presented as part of the 11th USENIX Conference on File and Storage Technologies (FAST 13); USENIX: San Jose, CA, 2013; pp. 243-256.

12. Wang, J.; Vakilinia, K.; Chen, T. Y.; Courtade, T.; Dong, G.; Zhang, T.; Shankar, H.; Wesel, R. Enhanced Precision Through Multiple Reads for LDPC Decoding in Flash Memories. *IEEE Journal on Selected Areas in Communications* 2014, 32, 880-891.

13. Lin, W.; Yen, S. W.; Hsu, Y. C.; Lin, Y. H.; Liang, L. C.; Wang, T. C.; Shih, P. Y.; Lai, K. H.; Cheng, K. Y.; Chang, C. Y. A low power and ultra-high reliability LDPC error correction engine with Digital Signal Processing for embedded NAND Flash Controller in 40 nm CMOS. Symposium on VLSI Circuits Digest of Technical Papers, 2014, pp. 1-2.

14. Haymaker, K.; Kelley, C. A. Structured Bit-Interleaved LDPC Codes for MLC Flash Memory. *IEEE Journal on Selected Areas in Communications* 2014, 32, 870-879.

15. Sandell, M.; Ismail, A. Machine Learning for LLR Estimation in Flash Memory With LDPC Codes. *IEEE Transactions on Circuits and Systems II: Express Briefs* 2021, 68, 792-796. doi:10.1109/TCSI.2020.3016979.

16. Bian, J.; Zhao, S.; Kong, L. Rate-adaptive Polar Codes Design for MLC NAND Flash Memory. IEEE 4th International Conference on Computer and Communications (ICCC), 2018, pp. 11-16. doi:10.1109/CompComm.2018.8780892.

17. Kong, L.; Liu, Y.; Liu, H.; Zhao, S. Protograph QC-LDPC and Rate-Adaptive Polar Codes Design for MLC NAND Flash Memories. *IEEE Access* 2019, 7, 37131-37140. doi:10.1109/ACCESS.2019.2904746.
18. Taranalli, V.; Uchikawa, H.; Siegel, P. H. Channel Models for Multi-Level Cell Flash Memories Based on Empirical Error Analysis. *IEEE Transactions on Communications* 2016, 64, 3169-3181.
19. Freudenberger, J.; Rajab, M.; Shavgulidze, S. Estimation of channel state information for non-volatile flash memories. IEEE 7th International Conference on Consumer Electronics (ICCE), 2017.
20. Freudenberger, J.; Rajab, M.; Shavgulidze, S. A Source and Channel Coding Approach for Improving Flash Memory Endurance. *IEEE Transactions on Very Large Scale Integration (VLSI) Systems* 2018, 26, 981-990. doi:10.1109/TVLSI.2018.2797078.
21. Sala, F.; Gabrys, R.; Dolecek, L. Dynamic Threshold Schemes for Multi-Level Non-Volatile Memories. *IEEE Transactions on Communications* 2013, 61, 2624-2634. doi:10.1109/TCOMM.2013.053013.120733.
22. Cao, C.; Fair, I. Mitigation of Inter-Cell Interference in Flash Memory With Capacity-Approaching Variable-Length Constrained Sequence Codes. *IEEE Journal on Selected Areas in Communications* 2016, 34, 2366-2377. doi:10.1109/JSAC.2016.2603663.
23. Yassine, H.; Coon, J. P.; Simmons, D. E. Index Programming for Flash Memory. *IEEE Transactions on Communications* 2017, 65, 1886-1898. doi:10.1109/TCOMM.2017.2669028.
24. Park, S. K.; Moon, J. Characterization of Inter-Cell Interference in 3D NAND Flash Memory. *IEEE Transactions on Circuits and Systems I: Regular Papers* 2021, 68, 1183-1192. doi:10.1109/TCSI.2020.3047484.
25. Cai, Y.; Luo, Y.; Haratsch, E. F.; Mai, K.; Mutlu, O. Data retention in MLC NAND flash memory: Characterization, optimization, and recovery. IEEE 21st International Symposium on High Performance Computer Architecture (HPCA), 2015, pp. 551-563. doi:10.1109/HPCA.2015.7056062.
26. Qi, S.; Feng, D.; Liu, J. Optimal voltage signal sensing of NAND flash memory for LDPC code. Signal Processing Systems (SiPS), 2014 IEEE Workshop on, 2014, pp. 1-6. doi:10.1109/SiPS.2014.6986077.
27. Zhou, H.; Jiang, A.; Bruck, J. Error-correcting schemes with dynamic thresholds in nonvolatile memories. Information Theory Proceedings (ISIT), 2011 IEEE International Symposium on. IEEE, 2011, pp. 2143-2147.
28. Lee, D.; Sung, W. Estimation of NAND Flash Memory Threshold Voltage Distribution for Optimum Soft-Decision Error Correction. *IEEE Transactions on Signal Processing* 2013, 61, 440-449.
29. Sala, F.; Gabrys, R.; Dolecek, L. Dynamic threshold schemes for multi-level non-volatile memories. *IEEE Transactions on Communications* 2013, 61, 2624-2634.
30. Lee, D. h.; Sung, W. Decision Directed Estimation of Threshold Voltage Distribution in NAND Flash Memory. *IEEE Transactions on Signal Processing* 2014, 62, 919-927. doi:10.1109/TSP.2013.2295056.
31. Peleato, B.; Agarwal, R.; Cioffi, J. M.; Qin, M.; Siegel, P. H. Adaptive read thresholds for NAND flash. *IEEE Transactions on Communications* 2015, 63, 3069-3081.
32 Rajab, M.; Thiers, J.; Freudenberger, J. Read Threshold Calibration for Non-Volatile Flash Memories. IEEE 9th International Conference on Consumer Electronics (ICCE-Berlin), 2019, pp. 119-123.
33. Yang, L.; Wang, Q.; Li, Q.; Yu, X.; He, J.; Huo, Z. Gradual Channel Estimation Method for TLC NAND Flash Memory. *IEEE Embedded Systems Letters* 2021, pp. 1-1. doi:10.1109/LES.2021.3081738.
34. Cai, Y.; Haratsch, E. F.; Mutlu, O.; Mai, K. Threshold voltage distribution in MLC NAND flash memory: Characterization, analysis, and modeling. 2013 Design, Automation Test in Europe Conference Exhibition (DATE), 2013, pp. 1285-1290. doi:10.7873/DATE.2013266.
35. Thiers, J. P.; Bailon, D. N.; Freudenberger, J. Bit-Labeling and Page Capacities of TLC Non-Volatile Flash Memories. IEEE 10th International Conference on Consumer Electronics (ICCE-Berlin), 2020, pp. 1-6. doi:10.1109/ICCE-Berlin50680.2020.9352190.
36. Miccoli, C.; Paolucci, G. M.; Compagnoni, C. M.; Spinelli, A. S.; Goda, A. Cycling pattern and read/bake conditions dependence of random telegraph noise in decananometer NAND flash arrays. IEEE International Reliability Physics Symposium, 2015, pp. MY.9.1-MY.9.6. doi:10.1109/IRPS.2015.7112812.
37. Samadder, T.; Kumar, S.; Thakor, K.; Mahapatra, S. A Theoretical Framework for Trap Generation and Passivation in NAND Flash Tunnel Oxide During Distributed Cycling and Retention Bake. IEEE International Reliability Physics Symposium (IRPS), 2021, pp. 1-6. doi:10.1109/1RPS46558.2021.9405104.
38. Yaakobi, E.; Ma, J.; Grupp, L.; Siegel, P.; Swanson, S.; Wolf, J. Error characterization and coding schemes for flash memories. IEEE GLOBECOM Workshops, 2010, pp. 1856-1860.
39. Cover, T. M.; Thomas, J. A. *Elements of Information Theory*; John Wiley & Sons, 1991.
40. MacKay, D. *Information Theory, Inference, and Learning Algorithms*; Cambridge University Press, 2003.

What is claimed is:

1. A method for read reference voltage calibration of a non-volatile memory (NVM) the method comprising:
   reading from the NVM predetermined reference data stored therein and being encoded with an error correction code, ECC, wherein the reading is performed when a read reference voltage of the NVM, which is used as a reference voltage for the reading, is set at a defined voltage level;
   decoding the read reference data and observing a number of bit errors in the read reference data in relation to the predetermined reference data; and
   defining a new voltage level of the read reference voltage for a subsequent reading of data from the NVM based on the observed number of bit errors and setting the read reference voltage to the defined new voltage level.

2. The method of claim 1, comprising:
   setting the read reference voltage to a predefined initial voltage level;
   performing at least one iteration run of an iterative decoding process until an exit criterion for a successful decoding is met, the decoding process comprising:
     reading the reference data from the NVM using the read reference voltage at the currently-set voltage level as a reference for the reading;
     determining, whether the currently read reference data is decodable;
     if the currently read reference data is found to be not decodable, setting the read reference voltage to an adapted voltage level being different from each of the initial voltage level and the voltage level the preceding run of the decoding process, if any;

else, decoding the currently read reference data;
observing a number of bit errors in the current read reference data in relation to the reference data;
defining the new voltage level of the read reference voltage for a subsequent reading of data from the NVM based on the observed number of bit errors and setting the read reference voltage to the defined new voltage level.

3. The method of claim 2, further comprising an initialization process for determining the predefined initial voltage level, the initialization process comprising:
determining the initial voltage level based on a voltage level of the read reference voltage used for reading at which a maximum of the mutual information I(E, Vopt) between the optimal voltage level Vopt of the reference voltage and an observed number E of bit errors in reference data occurs, wherein the mutual information I(E, Vopt) is determined over a set of measurements of E and Vopt at different life-cycle states of the NVM.

4. The method of claim 1, wherein the predetermined reference data comprises meta-data stored in the NVM, the meta-data representing one or more properties or states of the NVM and being encoded with a first ECC allowing for correcting a higher number of bit errors per codeword than a second ECC used for encoding payload data to be stored in the NVM.

5. The method of claim 1, wherein defining the new voltage level of the read reference voltage based on the observed number of bit errors comprises looking up the new voltage level in a look-up table (LUT) that defines a target voltage level of the read reference voltage as a function of an information representing a number of observed bit errors in decoded reference data.

6. The method of claim 1, further comprising a tracking process which comprises further optimizing the determined new voltage level of the read reference voltage based on an observed symmetry or asymmetry of the number of 1-to-0 and 0-to-1 bit errors in payload data being read from the NVM.

7. The method of claim 6, wherein consecutive read operations for reading payload data during the tracking process are performed in relation to consecutive pages of a memory block of the NVM.

8. The method of claim 6, wherein optimizing the determined new voltage level of the read reference voltage comprises:
setting for the read reference voltage an associated target probability for the asymmetry or symmetry, respectively, of 1-to-0 and 0-to-1 bit errors;
reading payload data from the NVM, decoding it, and determining a number of 1-to-0 bit errors and a number of 0-to-1 bit errors in the read payload data;
modifying the new voltage level based on the determined numbers of 1-to-0 bit errors and 0-to-1 bit errors such as to cause the ratio of these numbers to approach the target probability.

9. The method of claim 8, wherein the target probability is set so as to define an equilibrium of 1-to-0 bit errors and 0-to-1 bit errors.

10. The method of claim 8, wherein the target probability is set so as to define a particular ratio R≠1 of 1-to-0 errors and 0-to-1 bit errors.

11. The method of claim 8, wherein modifying the new voltage level based on the determined numbers of 1-to-0 bit errors and 0-to-1 bit errors in the read payload data such as to cause the ratio of these numbers to approach the target probability comprises:
defining a voltage step $\Delta V$;
performing at least one iteration run of the following iterative voltage level modification process, until the target probability for the asymmetry or symmetry, respectively, of 1-to-0 and 0-to-1 bit errors is met, at least within a defined error margin:
if the determined number of 0-to-1 bit errors is larger than indicated by the
target probability, decrease the new voltage level by $|\Delta V|$ for the next read operation for reading payload data;
else, increase the new voltage level by $|\Delta V|$ for the next read operation for reading payload data.

12. The method of claim 11, wherein the target probability is set so as to define an equilibrium of 1-to-0 bit errors and 0-to-1 bit errors.

13. The method of claim 11, wherein the target probability is set so as to define a particular ratio R≠1 of 1-to-0 errors and 0-to-1 bit errors.

14. The method of claim 1, wherein the NVM comprises memory cells being capable of storing two or more bits each and the method of any one of the preceding claims is performed in relation to multiple, particularly all, different read reference voltages of such memory cells of the NVM.

15. A memory controller, wherein the memory controller is configured to:
read predetermined reference data stored in an non-volatile memory (NVM) to yield read data, wherein the predetermined reference data is encoded with an error correction code (ECC), and wherein the reading the predetermined reference data is performed when a read reference voltage of the NVM, which is used as a reference voltage for the reading, is set at a defined voltage level;
decode the read reference data and observing a number of bit errors in the read reference data in relation to the predetermined reference data; and
define a new voltage level of the read reference voltage of the NVM for a subsequent reading of the predetermined reference data from the NVM based on the observed number of bit errors and setting the read reference voltage to the defined new voltage level.

16. The memory controller of claim 15, wherein the memory controller is included in a memory system configured to calibrate at least one read reference voltage of the NVM.

17. A non-transitory computer readable medium, the non-transitory computer readable medium having stored therein instructions that when executed by a processing resource cause the processing resource to:
read predetermined reference data stored in an non-volatile memory (NVM) to yield read data, wherein the predetermined reference data is encoded with an error correction code (ECC), and wherein the reading the predetermined reference data is performed when a read reference voltage of the NVM, which is used as a reference voltage for the reading, is set at a defined voltage level;
decode the read reference data, wherein a number of bit errors in the read reference data relative to the predetermined reference data is observed to yield an observed number of bit errors; and
define a new voltage level of the read reference voltage of the NVM for a subsequent reading of the predetermined reference data from the NVM based on the observed number of bit errors and setting the read reference voltage to the defined new voltage level.

18. The non-transitory computer readable medium of claim 17, wherein the non-transitory computer readable medium further has stored therein instructions that when executed by a processing resource cause the processing resource to:
- set the read reference voltage to a predefined initial voltage level;
- perform at least one iteration run of an iterative decoding process until an exit criterion for a successful decoding is met, the decoding process comprising:
  - reading the reference data from the NVM using the read reference voltage at the currently-set voltage level as a reference for the reading;
  - determining, whether the currently read reference data is decodable;
  - if the currently read reference data is found to be not decodable, setting the read reference voltage to an adapted voltage level being different from each of the initial voltage level and the voltage level the preceding run of the decoding process, if any;
  - else, decoding the currently read reference data;
  - observing a number of bit errors in the current read reference data in relation to the reference data;
  - defining the new voltage level of the read reference voltage for a subsequent reading of data from the NVM based on the observed number of bit errors and setting the read reference voltage to the defined new voltage level.

19. The non-transitory computer readable medium of claim 17, wherein the non-transitory computer readable medium further has stored therein instructions that when executed by a processing resource cause the processing resource to:
- perform an initialization process for determining the predefined initial voltage level, the initialization process comprising:
  - determining the initial voltage level based on a voltage level of the read reference voltage used for reading at which a maximum of the mutual information $I(E, Vopt)$ between the optimal voltage level Vopt of the reference voltage and an observed number E of bit errors in reference data occurs, wherein the mutual information $I(E, Vopt)$ is determined over a set of measurements of E and Vopt at different life-cycle states of the NVM.

20. The non-transitory computer readable medium of claim 17, wherein the predetermined reference data comprises meta-data stored in the NVM, the meta-data representing one or more properties or states of the NVM and being encoded with a first ECC allowing for correcting a higher number of bit errors per codeword than a second ECC used for encoding payload data to be stored in the NVM.

* * * * *